United States Patent
Schauman et al.

(10) Patent No.: US 11,802,926 B2
(45) Date of Patent: Oct. 31, 2023

(54) METHODS AND SYSTEMS FOR OPTIMIZING SAMPLING EFFICIENCY OF DYNAMICALLY SAMPLED MAGNETIC RESONANCE IMAGING (MRI)

(71) Applicant: Oxford University Innovation Limited, Oxford (GB)

(72) Inventors: Sonja Sophie Schauman, Oxford (GB); Mark Chiew, Oxford (GB); Thomas Okell, Oxford (GB)

(73) Assignee: OXFORD UNIVERSITY INNOVATION LIMITED, Oxford (GB)

(*) Notice: Subject to any disclaimer, the term of this patent is extended or adjusted under 35 U.S.C. 154(b) by 0 days.

(21) Appl. No.: 17/523,969

(22) Filed: Nov. 11, 2021

(65) Prior Publication Data

US 2022/0146615 A1 May 12, 2022

Related U.S. Application Data

(60) Provisional application No. 63/112,862, filed on Nov. 12, 2020.

(51) Int. Cl.
| | |
|---|---|
| *G01V 3/00* | (2006.01) |
| *G01R 33/56* | (2006.01) |
| *G06T 11/00* | (2006.01) |
| *G01R 33/48* | (2006.01) |

(52) U.S. Cl.
CPC ..... *G01R 33/5608* (2013.01); *G01R 33/4818* (2013.01); *G06T 11/005* (2013.01); *G06T 2210/41* (2013.01)

(58) Field of Classification Search
CPC .............. G01R 33/3415; G01R 33/543; G01R 33/5659; G01R 33/36; A61B 5/055
USPC .......................................................... 324/309
See application file for complete search history.

(56) References Cited

U.S. PATENT DOCUMENTS

2017/0307714 A1* 10/2017 Okell ............... G01R 33/56366

FOREIGN PATENT DOCUMENTS

| CN | 104080405 B | * | 10/2017 | ............. A61B 6/022 |
|---|---|---|---|---|
| CN | 107750338 A | * | 3/2018 | ......... G01R 33/4826 |
| DE | 102009050662 A1 | * | 4/2011 | ......... G01R 33/4824 |
| DE | 102014220328 B3 | * | 8/2015 | ......... G01R 33/4824 |
| WO | WO-2007085342 A1 | * | 8/2007 | ........... G01R 33/482 |

* cited by examiner

*Primary Examiner* — Walter L Lindsay, Jr.
*Assistant Examiner* — Frederick Wenderoth
(74) *Attorney, Agent, or Firm* — Thomas|Horstemeyer, LLP

(57) ABSTRACT

The present disclosure is directed to radially-based magnetic resonance imaging. In any one or more embodiments, the present methods and systems provide that the angular increment between subsequent radial k-space spokes to be sampled to provide the imaging is performed for a predetermined or pre-defined restricted set of reconstruction window sizes (numbers of radial spokes per frame), or limited views, to maximize the uniformity of sampling within the restricted set of window sizes.

22 Claims, 12 Drawing Sheets
(9 of 12 Drawing Sheet(s) Filed in Color)

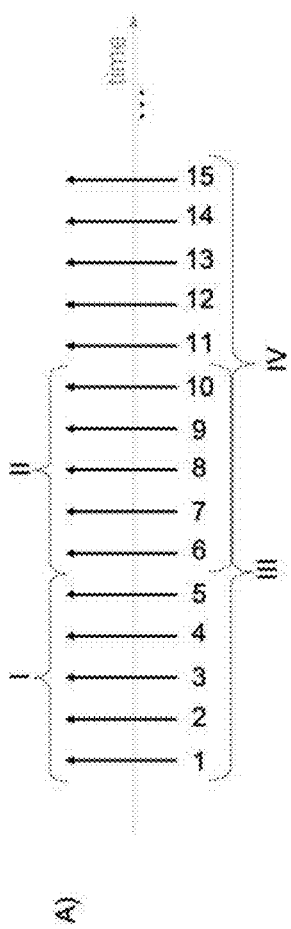
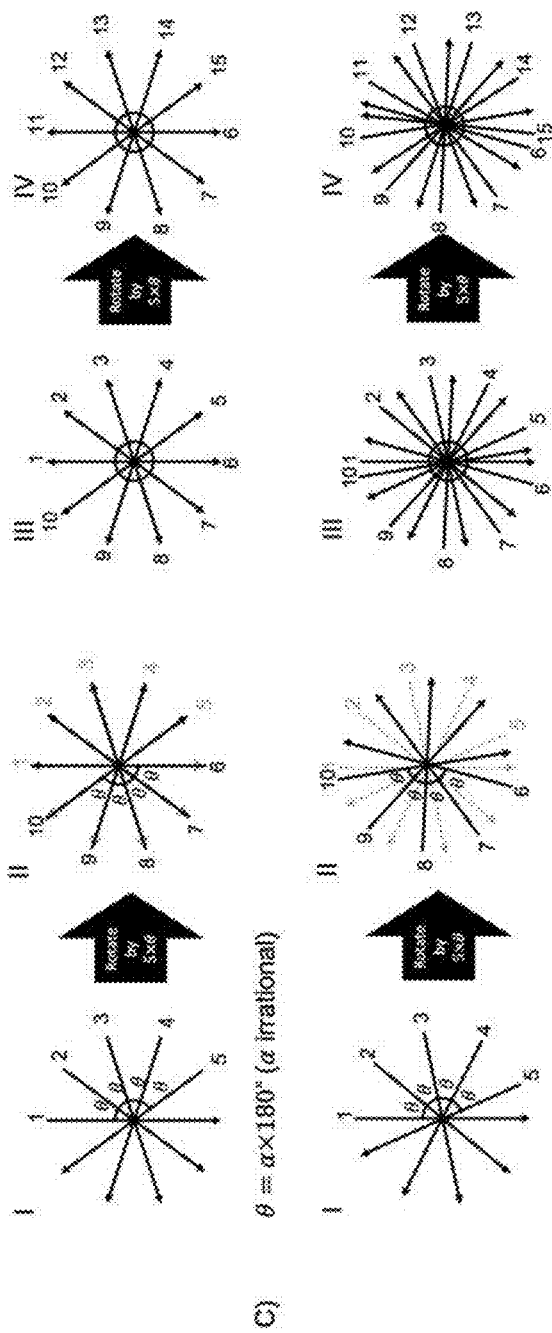
FIG. 1A
FIG. 1B
FIG. 1C

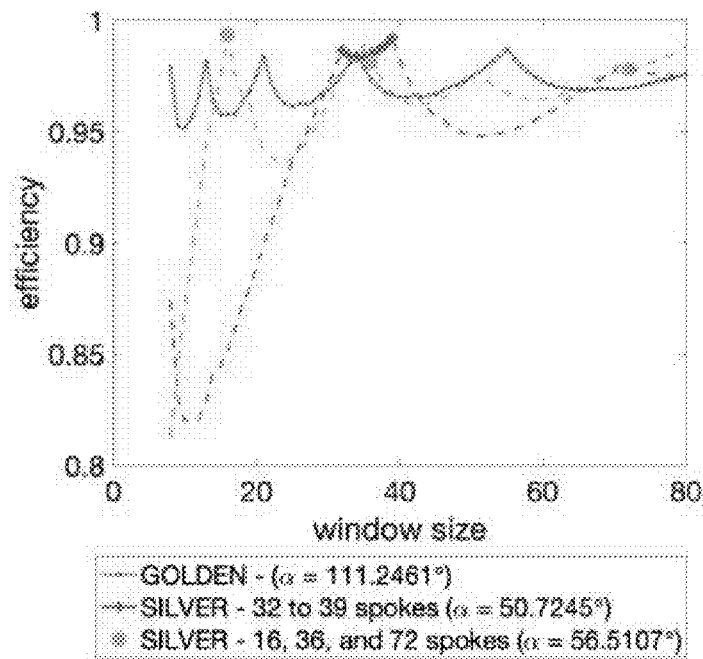
FIG. 6
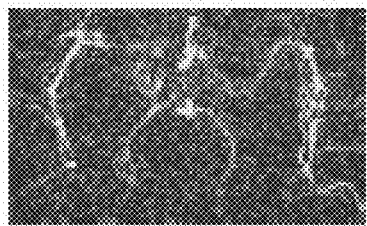
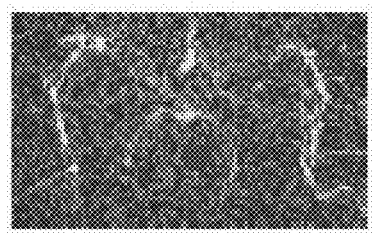
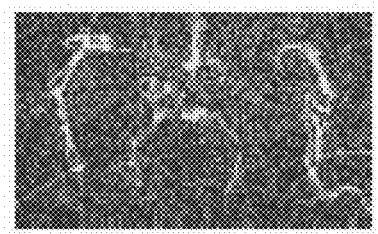
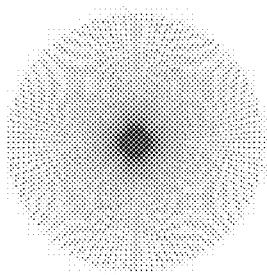
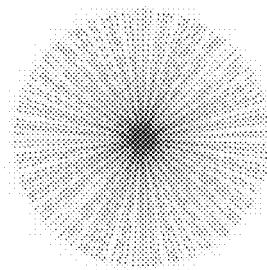
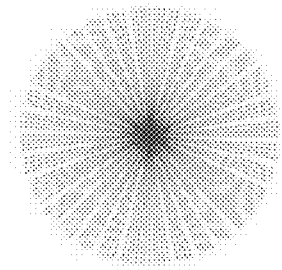
FIG. 7A          FIG. 7B          FIG. 7C

METHODS AND SYSTEMS FOR OPTIMIZING SAMPLING EFFICIENCY OF DYNAMICALLY SAMPLED MAGNETIC RESONANCE IMAGING (MRI)

CROSS-REFERENCE TO RELATED APPLICATION

This application claims the benefit of and priority to U.S. Provisional Patent Application No. 63/112,862 filed Nov. 12, 2020, which is entirely incorporated herein by reference.

TECHNICAL FIELD

The present disclosure generally relates to systems and methods for dynamic imaging, in particular to provide researchers and clinicians information regarding dynamic physiological processes.

BACKGROUND

Radially sampled MRI, such as Golden ratio-based sampling, has been proposed for dynamic MRI imaging methods. Examples of use cases include blood flow imaging, cardiac imaging, and real-time speech imaging, for example. Sampling uniformity, however, can affect image signal-to-noise ratio (SNR). SNR scales with uniformity of sampling density. For a radially sampled MRI completely uniform spaced radial sampling is ideal from the point of SNR. However, this requirement lacks post-acquisition reconstruction flexibility, which is often needed in dynamic imaging. Completely uniform radial sampling requires complete a-priori knowledge of how many radial spokes will be combined to form an image during reconstruction, which is not always possible. Completely uniform sampling also does not allow for flexibility in reconstructing the same data set at multiple temporal resolutions.

There is, therefore, a need to address the aforementioned deficiencies accordingly.

SUMMARY

Provided herein are methods and systems for radially sampled MRI that address and overcome the aforementioned deficiencies. It has been determined herein that complete, or near-optimal, sampling uniformity (uniform sampling density) for an arbitrary number of radial spokes is unnecessary for most applications. Instead, new sampling methods and systems are described herein that provide greater post-acquisition flexibility than uniform sampling while achieving image SNR that is equal to or better than prior Golden ratio-based methods, by only seeking to achieve optimal sampling uniformity within a restricted set of radial spoke numbers.

In any one or more embodiments, the present methods and systems provide that the angular increment between subsequent radial spokes to be sampled is performed for a predetermined or pre-defined restricted set of reconstruction window sizes (numbers of spokes per frame), or limited views, to seek maximizing the uniformity of sampling within the restricted set of window sizes. In any one or more aspects of any one or more embodiments, the angular increment can be determined and can be a fixed or set increment. The manner in which the angular increment can be set is, in any one or more aspects, described herein. In doing so, the requirement for uniformity is relaxed and the sampling is applied to a specific predetermined or pre-defined set of window sizes that can achieve greater flexibility in post sample acquisition reconstruction than uniform sampling, whilst achieving higher sampling efficiency and greater or equal image SNR to golden ratio sampled spokes. Such increased SNR leads to improved images that can show features in an image that may have been missed with other methods as such features are indistinguishable from background noise.

Without intending to be limiting, the embodiments, systems and methods as described herein can provide blood flow and tissue perfusion information to help make diagnostic, prognostic and/or therapeutic decisions. In other embodiments, systems and methods as described herein can be used in basic science contexts to provide dynamic imaging that is useful in the study of physiological processes, for example speech production.

Also, provided herein are MRI-based systems and methods that can use the present sampling methods. Methods and systems as described herein provide for increased signal-to-noise (SNR) ratio compared to previous scans utilizing golden ratio approaches. Such increased SNR leads to improved images that can show features in an image that may have been missed with other methods as such features are indistinguishable from background noise.

Without intending to be limiting, in embodiments, the present methods and systems can be applied to any organ in any living being that contains fluid in a vascular network that is perfused into tissue. In embodiments, the present systems and methods can be useful in the detection, prognosis, and therapeutic monitoring of a range of diseases, such as stroke (ischemic and hemorrhagic). For example, with ischemic strokes, where blockages or narrowing of arteries, or vessels that supply fluid to tissue, can be assessed, along with the effect this has on perfusion to the tissue. The present systems and methods can also be useful for assessing blood supply to tumours or arteriovenous malformations, amongst other diseases. The present systems and methods can be used in a longitudinal manner, and can be used to evaluate patients before, during, and after disease detection and resulting therapy.

In an embodiment, the present sampling methods and systems can be implemented providing a combined angiography and perfusion using radial imaging and arterial spin labeling (CAPRIA) sequence, such as illustrated in FIG. 11, where the angular increment is optimized before the scan is initiated.

In any one or more aspects of any one or more embodiments, the angular increment can be a fixed or set increment. In any one or more aspects of any one or more of the embodiments, the angular increment between subsequent radial spokes to be sampled is performed for a predetermined or pre-defined restricted set of reconstruction window sizes (numbers of spokes per frame), or limited views, to seek maximizing the uniformity of sampling within the restricted set of window sizes.

In addition, in an aspect, a variable flip angle imaging scheme is shown to benefit the visualization of tissue perfusion without compromising angiographic image quality and can be used in combination with optimized angular increments between spokes as discussed herein. The angiographic and perfusion images can be constructed in 2D, 3D or even 4D. In an aspect, a full 4D (time-resolved 3D) implementation is provided to obtain whole brain dynamic angiograms and perfusion maps within a single scan.

In an embodiment, the present methods and systems can use, but are not limited to, an arterial spin labeling (ASL) preparation[s] to label the blood followed by radial readout scheme using the present sampling method, for example including an optimized, fixed, angular increment within a predetermined or pre-defined set of window sizes (numbers of spokes per frame) to continuously image the labeled blood all the way through the large arteries and into the tissue. Images can also be acquired where the blood is not labeled (control images). The use of the present sampling scheme provides that the same raw data set can be reconstructed at different temporal and spatial resolutions that can be chosen retrospectively. A maximized angular scheme can be applied that provides for improved signal-to-noise ratio (SNR), leading to improved images with higher resolution. In various aspects, images of dynamic physiological processes can be constructed in 2D, 3D or even 4D.

Methods and systems as described herein utilizing the present sampling methods generally give a more uniform distribution of radial k-space compared to prior methods, for example system and methods that employ a Golden ratio scheme. Such a more uniform distribution of k-space further leads to improved images by reducing artefacts in the reconstructed image, for example streaking artefacts.

In any one or more aspects of any one or more embodiments herein, a set of window sizes for image reconstruction can be defined, the set of window sizes comprising a plurality of window sizes, wherein each window size is defined as the number of radial spokes in a window. A uniformity metric can be applied to the defined set of window sizes to determine a sampling efficiency of any sampling pattern generated therefrom with a set angular increment between subsequent radial spokes within a window and a desired angular increment based on the applied uniformity metric within the defined set of window sizes can be determined.

The uniformity metric used to determine a desired angular increment within a predetermined or pre-defined set or restricted set of window sizes (numbers of spokes per frame) can be selected from methods known in the art. The desired angular increment can be one that seeks to maximize the uniformity of sampling within the defined set of window sizes. For example, the uniformity metric can use or apply an average distance to nearest radial neighbors. Winkelmann S, Schaeffter T, Koehler T, Eggers H, Doessel O. An Optimal Radial Profile Order Based on the Golden Ratio for Time-Resolved MRI. IEEE Trans. Med. Imaging 2007; 26:68-76 doi: 10.1109/TMI.2006.885337. The uniformity metric can also apply an electrostatic potential which produces the lowest electrostatic potential within the set of window sizes, such as electrostatic potential measurements to determine the uniformity (or lack thereof) of radial spokes that results from particular angular increment[s] between spokes in 2D or 3D. Schauman S S, Okell T W, Chiew M. The Set Increment with Limited Views Encoding Ratio (SILVER) Method for Optimizing Radial Sampling of Dynamic MRI. BioRxiv 2020. https://doi.org/10.1101/2020.06.25.171017. The uniformity metric can also apply one or more uniformity measurements using the Pipe-Menon method. Pipe J G, Menon P. Sampling density compensation in MRI: Rationale and an iterative numerical solution. Magn. Reson. Med. 1999; 41:179-86 doi: 10.1002/(sici)1522-2594(199901)41: 1<179:aid-mrm25>3.0.co;2-v. Other measures of uniformity can be employed, for example examining the locus of each spoke and determining how far away each spoke is away from its neighbors. One such specific example that can be employed is the Clustered-Random-Regular (CRR) metric as was used by Fyrdahl et al. (Fyrdahl, A., Holst, K., Caidahl, K. et al. Generalization of three-dimensional golden-angle radial acquisition to reduce eddy current artifacts in bSSFP CMR imaging. Magn Reson Mater Phy (2020). https://doi.org/10.1007/s10334-020-00859-2, which is incorporated by reference herein regarding CRR).

Compared to prior art methods, such as Golden ratio methods, if one determines or defines in advance the number of spokes to be optimized within a selected set of window sizes, improved images can be reconstructed based on systems and using methods as described herein. For example, it can be possible to know or otherwise estimate the number of spokes within a cardiac cycle (which is generally in the range 500 ms to 2 seconds for human subjects) for determining or defining the window sizes.

With multiple temporal resolutions, there can be a tradeoff between temporal sampling and number of spokes. For example, with multiple temporal resolutions the same data set can be reconstructed low spatial resolution with short temporal resolution or higher spatial resolution and longer temporal resolution (assuming the Nyquist limit is reached). Alternatively, short temporal resolution can be treated as more highly under-sampled images and longer temporal resolution with less under-sampling.

In particular, linear reconstruction benefits from systems and methods as described herein, although an effect can be seen with non-linear reconstruction as well. An example of a linear reconstruction method that can be employed in methods according to the present disclosure is SENSE (Pruessmann K P, Weiger M, Börnert P, Boesiger P. Advances in sensitivity encoding with arbitrary k-space trajectories: SENSE With Arbitrary k-Space Trajectories. Magn. Reson. Med. 2001; 46:638-651 doi: 10.1002/mrm.1241) and an example of a non-linear reconstruction method is compressed sensing (Lustig M, Donoho D, Pauly J M. Sparse MRI: The application of compressed sensing for rapid MR imaging. Magn. Reson. Med. 2007; 58:1182-1195 doi: 10.1002/mrm.21391).

In an embodiment, a computer implemented method for radial imaging is provided. The method can comprise the steps of: (a) defining a set of window sizes for image reconstruction, the set of window sizes comprising a plurality of window sizes, wherein each window size is defined as the number of radial spokes in a window; (b) applying a uniformity metric to the defined set of window sizes to determine a sampling efficiency of any sampling pattern generated therefrom with a set angular increment between subsequent radial spokes within a window; (c) determining a desired angular increment based on the applied uniformity metric within the defined set of window sizes; (d) applying the desired angular increment determined in step (c) to acquire an image data set using the radial spokes; and (e) reconstructing one or more images from the acquired image data set.

In an embodiment, a system for radial imaging is provided. The system can comprise: at least one computing device; at least one application executable in the at least one computing device, the at least one application comprising logic that when executed in the at least one computing device: (a) defines a set of window sizes for image reconstruction, the set of window sizes comprising a plurality of window sizes, wherein each window size is defined as the number of radial spokes in a window; (b) applies a uniformity metric to the defined set of window sizes to determine a sampling efficiency of any sampling pattern generated therefrom with a set angular increment between subsequent radial spokes within a window; (c) determines a desired angular increment based on the applied uniformity metric within the defined set of window sizes; (d) applies the desired angular increment determined in step (c) to acquire an image data set using the radial spokes; and (e) reconstructs one or more images from the acquired image data set.

In any one or more aspects of any one or more embodiments described herein, the radially-based MR imaging can comprise sampling k-space radial spokes and the direction of each k-space radial sampling spoke can be determined as a set or fixed angular increment from a previous radial spoke. The angular increment of step (a) can be the reciprocal of the number of radial spokes to be used to reconstruct one window frame or size. The desired angular increment can be one that seeks to maximize the uniformity of sampling within the defined set of window sizes. An average distance to nearest radial neighbors can be used as the uniformity metric for determining the sampling efficiency. An electrostatic potential method can be used as the uniformity metric for determining the sampling efficiency. Electrostatic potential measurements which produce the lowest electrostatic potential within the set of window sizes method can be used as the uniformity metric for determining the sampling efficiency. The Pipe-Menon method can be used as the uniformity metric for determining the sampling efficiency. The method used to determine a local sampling density as the uniformity metric for determining the sampling efficiency can use a Clustered-Random-Regular (CRR) metric. The locus of each radial spoke and determining how far away each radial spoke is away from its neighbors can be used as the uniformity metric for determining the sampling efficiency. The defined set of window sizes can be comprised of windows having varying sizes, the size of each window defined by the number of radial spokes in the window. The angular increment applied to acquire an image data set can be an angular increment 180*$\alpha$ degrees, wherein 0<$\alpha$<1. The radially-based imaging can include taking radial samples in a plane. The radially-based imaging can include taking radial samples within a sphere of k-space. A fixed angular increment and a fixed step in a direction perpendicular to a plane of angular rotation of the radial spokes can be applied to acquire an image data set. Both the angular increment and a linear step in another direction can be applied to acquire an image data set.

In any one or more aspects of any one or more embodiments described herein, the radial imaging can include incrementing an azimuthal angle using the present sampling method including an optimized angular increment within a selected restricted set of window sizes. The optimized angular increment can be determined by applying one or more uniformity metrics to the restricted or defined set of window sizes to determine a sampling efficiency of any sampling pattern generated therefrom as described herein, including through electrostatic potential measurements.

In any one or more aspects of any one or more of the embodiments described herein, the acquired data can be used to estimate and correct for subject motion and drift in scanner parameters (such as drift in the main magnetic field strength). For example, a series of low spatial resolution but high temporal resolution images can be reconstructed from the data and used to estimate the subject motion. These motion estimates can be used to correct for motion in the image reconstruction process. A similar process can for magnetic field drift, where the drift can be estimated from a central region of k-space (or even just the central point in k-space) with high temporal resolution and corrected for during image reconstruction. Variable flip angles for imaging can be used.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. The patent or application file contains at least one drawing executed in color. Copies of this patent or patent application publication with color drawing(s) will be provided by the Office upon request and payment of the necessary fee.

FIGS. 1A-1C illustrate the effect of set increment radial sampling with rational and irrational increments. (FIG. 1A) demonstrates four different groupings of subsequent spokes (I, II, III, and IV) and gives each spoke a number. (FIG. 1B) shows how the subsequent spokes in the different frames relate if $\alpha$ is rational (in this case 1/5), showing how both non-overlapping and overlapping frames have repeats of the same spokes. (FIG. 1C) shows the effect of an irrational $\alpha$; Non-overlapping subsequent frames have no repeat spokes, and overlapping frames have some of the same spokes. In both (FIG. 1B) and (FIG. 1C) a subsequent frame (whether overlapping or not) is simply a rotation of the previous frame and will thus have the same level of uniformity in each case.

FIG. 4A shows the average result for different optimization sets and numbers of spokes per window, N. FIG. 4B shows an example of the noise amplification maps for one specific SILVER optimization range compared with radially uniform sampling and golden ratio (GR).

FIG. 5A shows a frame of the dynamic phantom reconstructed with 16 spokes per frame with either a uniform radial (left), golden ratio (center), or SILVER trajectory (right). Below each image is the error between it and the ground truth. There are small but measurable SNR differences between these reconstructions as shown by the bar chart in (FIG. 5C). Similarly, an example of an in-vivo angiogram (temporal average after reconstruction) acquired with three different trajectories (68 spokes per frame) is shown in (FIG. 5B) and the combined SNR measurements in three subjects in (FIG. 5D). In vivo SNR can have the same trend as the simulations although the differences are not significant.

FIG. 6 is a plot showing efficiency for different window sizes. Markers placed on points show those targeted for optimization. Dashed lines show efficiencies outside the optimal range.

FIGS. 7A-7C show details of in-vivo angiograms acquired with the three trajectories (FIG. 7A: uniform; FIG. 7B: golden ratio; FIG. 7C: SILVER) shown below. 72 spokes, R=4.3. The red arrow points out a vessel that is lost to noise in the golden angle sampled image, but visible with the SILVER method.

FIG. 9A), and for the SILVER method (right; FIG. 9B). More clustering can be seen among the golden ratio spokes.

DETAILED DESCRIPTION

Figure 2:
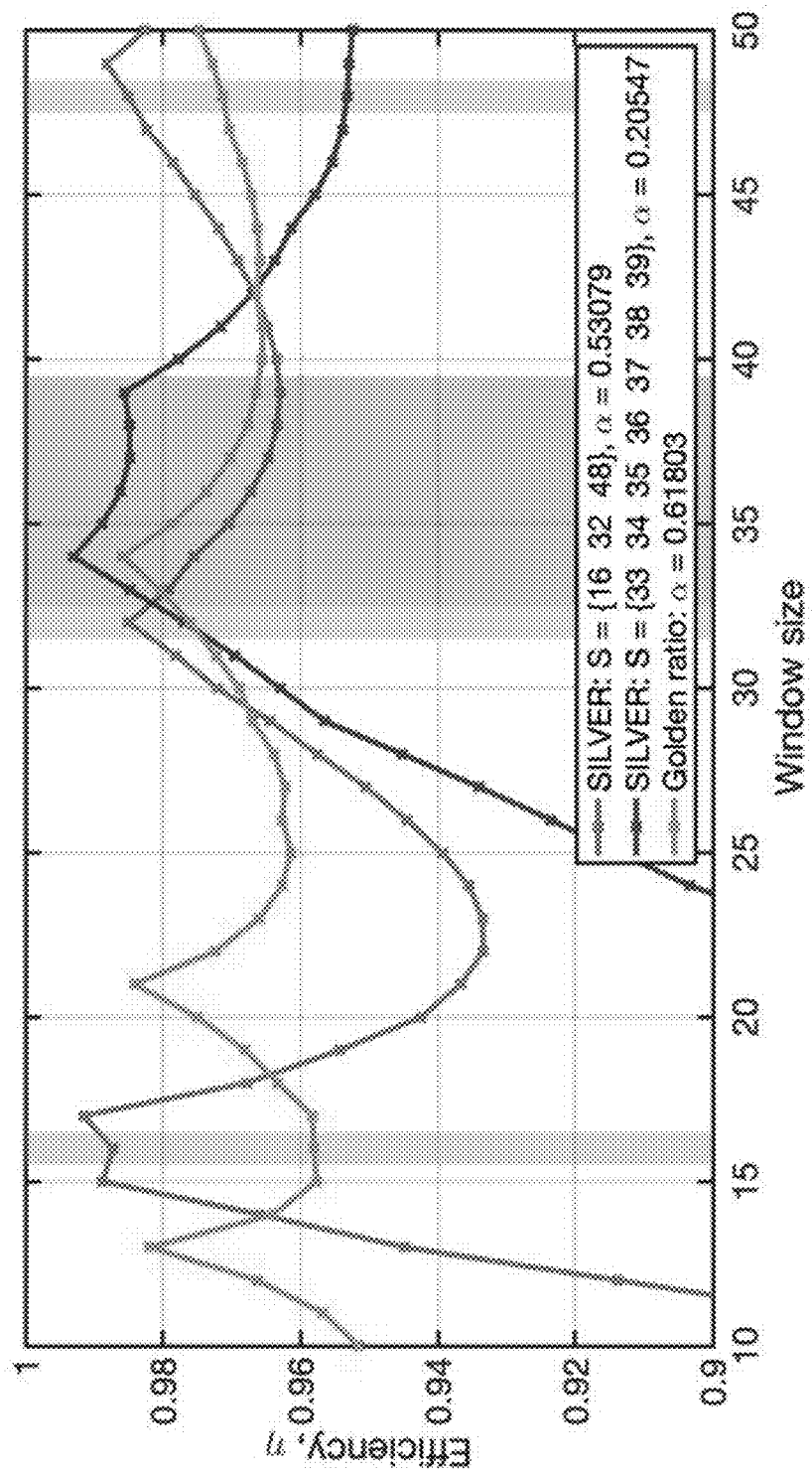
FIG. 2 is a plot showing two examples of SILVER efficiencies (light and dark grey) compared with the golden ratio (orange) in a range of window sizes. The golden ratio has typical peaks at the Fibonacci numbers, SILVER has much more irregular peaks. The minimum efficiency for SILVER within the optimized range (shaded) is higher than for the golden ratio.

Described below are various embodiments of the present systems and methods for maximizing sampling efficiency of dynamically sampled magnetic resonance imaging. Although particular embodiments are described, those embodiments are mere exemplary implementations of the system and method. One skilled in the art will recognize other embodiments are possible. All such embodiments are intended to fall within the scope of this disclosure. Moreover, all references cited herein are intended to be and are hereby incorporated by reference into this disclosure as if fully set forth herein. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure.

Discussion

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference in full as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

It is also to be understood that the terminology used herein is for purposes of describing particular embodiments only and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Description

Described herein are methods and systems for radially sampled MRI. The present methods and systems provide a simple method for improving signal-to-noise ratio (SNR) and incoherence of aliasing artifacts in radial magnetic resonance (MR) imaging when under-sampled, as compared for example to the commonly used Golden ratio method, whilst maintaining the properties of Golden ratio sampling like the ability to do sliding temporal reconstruction windows and flexible temporal resolution. It has been discovered that the angular increment between subsequent radial readouts does not need to produce near-optimal uniformity for any number of spokes as in the case of the Golden ratio method, but rather the angular increment can be optimized for a predetermined restricted set of reconstruction widow sizes (number of spokes per frame). Thus, for example, by determining a uniformity for different angle increments using the number of spokes in the range of interest, namely within the predetermined restricted set of window sizes, an optimum for that range can be determined that works better than the Golden ratio method.

The methods and systems described herein provide a new approach for determining an angular increment between subsequently acquired k-space spokes in a radial or other regularly sampled MRI experiment when the total number of readouts used per frame is unknown or not determined at the time of acquisition, or the data will be reconstructed with multiple different temporal resolutions. In any one or more aspects of any one or more embodiments herein, such methods are also referred to herein as Set Increment with Limited Views Encoding Ratio (SILVER). Such methods for optimizing the angular increment can be employed within methods of image reconstruction comprising radial MR imaging, for example. Although radial imaging is described as exemplary embodiment, it would be understood by the skilled artisan that other regularly sampled MRI methods than radial methods can benefit by employing the sampling methods as described herein.

Methods and systems as described herein can be utilized for any MRI method that currently uses radially-based sampling. Although the present sampling methods originally were developed for radial sampling, they can also be used for other sampling trajectories that rely on a simple increment between subsequently acquired MRI readout sub-units (e.g. spirals or cones). Such methods can benefit from using the present sampling methods as they have the same properties as the Golden ratio method but achieves better image quality as long as the number of radial spokes to use in a frame is approximately known. These methods are commonly used for dynamic MRI. For example, blood flow imaging, cardiac imaging, and real-time speech imaging, commonly use the golden ratio sampling method.

In any one or more embodiments herein, SILVER is a simple method for improving signal-to-noise ratio (SNR) and incoherence of aliasing artifacts when under-sampled, compared to the commonly used Golden ratio method (Winkelmann et al. 2007), whilst maintaining the properties of Golden ratio sampling like the ability to do sliding temporal reconstruction windows and flexible temporal resolution. Compared to previous methods, such as Golden ratio-based sampling, an objective behind SILVER is that the increment between subsequent readouts does not need to produce near-optimal uniformity for any number of spokes (which the Golden ratio method does), but rather can be optimized for a selected range or set of plausible readout numbers, such as a restricted set of window sizes (numbers of spokes per frame).

Regarding the theory behind the present sampling methods (SILVER), in any one or more embodiments, the closer to uniform sampling one can get, the higher the SNR of an imaging experiment will be. However, if one does not know in advance how many readouts, e.g. radially sampled spokes, that will be used in a frame the optimal sampling efficiency (uniform sampling density) cannot be achieved. Previously, this has been avoided by using the Golden ratio ($\phi$) method, where the radial readouts are rotated by the golden angle ($180/\phi$, or approximately 111.25 degrees) for each step, and that always adds a new spoke in the largest gap achieving near-uniform polar sampling. The Golden ratio method is optimal if the number of spokes to use in a frame is completely unknown (anywhere between one and infinity), but in most cases the imaging experiments are planned for an approximate number of spokes to use in each frame. By calculating the uniformity for different angle increments using the number of spokes in the restricted range of interest (i.e., in a selected restricted window size) an optimum for that range can be found that works better than the Golden ratio.

Figure 12:
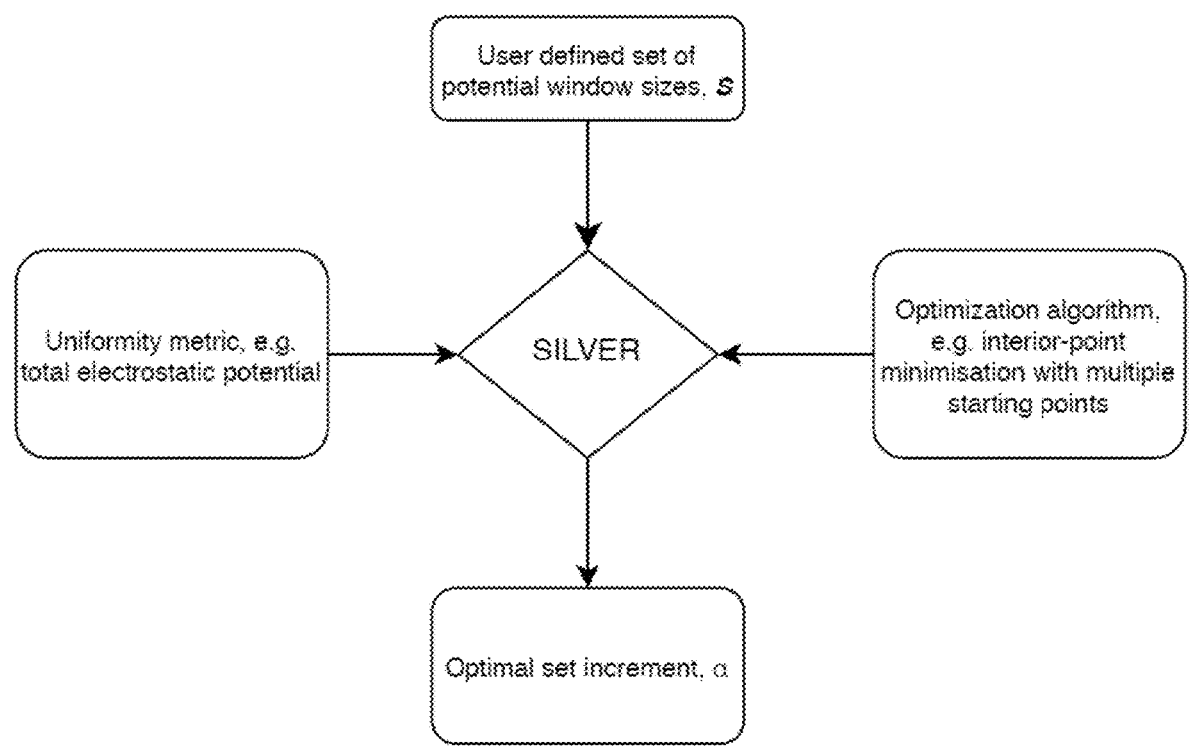
FIG. 12 is a flow chart of a method of the present disclosure.

An embodiment of the present sampling method for radially-based MR imaging is illustrated in the flow chart of FIG. 12. The method determines or otherwise provides information for the determination of an angular increment between subsequent radially sampled spokes that provides maximal uniformity for a predetermined or pre-defined restricted set of reconstruction window sizes (numbers of spokes per frame) for carrying out the radially-based sampling for MR imaging. In any one or more aspects, the method can include k-space radially-based sampling.

With reference to FIG. 12, in any one or more aspects of any one or more embodiments herein, the systems and methods can: (a) define a set of window sizes for image reconstruction, the set of window sizes comprising a plurality of window sizes, wherein each window size is defined as the number of radial spokes in a window; (b) apply a uniformity metric to the defined set of window sizes to determine a sampling efficiency of any sampling pattern generated therefrom with a set angular increment between subsequent radial spokes within a window; (c) determine a desired angular increment based on the applied uniformity metric within the defined set of window sizes; (d) apply the desired angular increment determined in step (c) to acquire an image data set using the radial spokes; and (e) reconstruct one or more images from the acquired image data set. Any one or more of a number of uniformity metrics can be applied, for example such as those described herein.

For 2D radial trajectories, in any one or more aspects, a set increment can be simply a constant angle increment ($\theta = \alpha \times 180°$) from the previous spoke. Depending on whether this step is a rational or irrational fraction of the whole circle the acquired data can be combined in different ways.

For 3D imaging, in any one or more aspects, a fixed angular increment and a fixed step in a direction perpendicular to a plane of angular rotation of the radial spokes can be applied. Both the angular increment and a linear step in another direction, for example a linear step in a direction perpendicular to a plane of the angular rotation, can be applied to acquire the image data set.

When the step ratio, $\alpha$, is a rational fraction, the exact same spoke will eventually be repeated, whereas if the step is irrational or rational with a very large denominator in its simplest form, no two spokes acquired within the duration of the experiment will be the same. In dynamic imaging experiments where the length of a frame is unknown a-priori, practically irrational increments can be preferred to avoid acquiring the same spoke again within the frame. Similarly, if multiple temporal resolutions are required it can also be beneficial to use irrational sampling to avoid duplicate spokes in the different window sizes, especially if data is combined across frames to be reconstructed such that the Nyquist criterion is met. For this reason, the Golden ratio, which is often referred to as the most irrational number (7), is often used to sample when no periodicity is wanted, and every new spoke should fill k-space with near-optimal uniformity.

Another benefit of acquiring data in k-space with a set angular increment, regardless of whether the step ratio is rational or practically irrational, is that images with the same sampling efficiency can be reconstructed with any N subsequently acquired spokes. Each k-space trajectory will simply be a rotated version of the N previous spokes, rotated by Nα×180° (FIGS. 1B and 1C). This allows for sliding window (8) and view sharing (9) reconstructions with complete flexibility in where to start and end each frame.

Uniform radial sampling with full width spokes can be achieved with set increment sampling by choosing the angular increment between subsequently acquired spokes to be $$\alpha_{uniform} = \frac{1}{N},$$

where N is the number of spokes used to reconstruct one window frame. In Golden ratio sampling, on the other hand, the step is instead approximately 111.246°, with $$\alpha_{golden} = \frac{1}{\phi} = \frac{\sqrt{5}-1}{2} \approx 0.6180.$$

An objective of SILVER is to find a more optimal increment, $0<\alpha<1$, when near uniformity is only required for a certain restricted set of window sizes.

In any one or more aspects of any one or more embodiments herein, the sampling method can include applying a uniformity metric to determine a sampling efficiency. Radial sampling in a linear acquisition and reconstruction framework has intrinsically lower SNR than Cartesian sampling due to the variable density with which k-space is sampled (10). Among radial sampling methods, radially uniform sampling can achieve the highest SNR, and performance for a fixed number of spokes degrades the more non-uniform the sampling is.

Because SNR intrinsically depends on the local sampling density, different methods for estimating the local sampling density have been proposed. For radial sampling in particular, Winkelmann et al (5), defined sampling density by the inverse of the average azimuthal distance between adjacent spokes. Others have used analytically defined continuous density distributions that were used to generate the trajectory (10), numerically defined approaches using voronoi cells on spheres (11), or physical models based on electrostatic properties (12-14), or the aforementioned CRR metric.

Electrostatic methods are more commonly used as a 3D method but can also be generalized to 2D sampling. In any one or more aspects herein, an electrostatic potential minimizing model can be used because of its easy extension to 3D in the future and its high penalty for overlapping spokes.

The electrostatic potential method can model the radial sampling pattern as an ensemble of unit charges placed on both ends of each sampling spoke, constrained to the unit circle (2D) or unit sphere (3D). Efficiency compared to radially uniform sampling, η is then defined as the ratio of total electrostatic potential stored in the system of point charges, U, to a system with the same number of uniformly distributed points (the lowest possible energy state), $U_{ref}$:

$$\eta = \frac{U_{ref}}{U}$$

$$U = \sum_{i,j=1}^{2N(i \neq j)} 1/r_{ij}$$

Where $r_{ij}$ is the distance between the ith and jth points, and N is the number of spokes (2N is therefore the number of spoke tips to consider). For a set increment, α, U generalizes to a function of α and N. For a uniform distribution α is 1/N so $U_{ref}$ is simply a function of N.

In any one or more aspects of any one or more embodiments herein, the sampling method can include defining a set of window sizes for image reconstruction, the set of window sizes comprising a plurality of window sizes, wherein each window size is defined as the number of radial spokes in a window and determining a sampling efficiency based on the defined set of window sizes. FIG. 6 is a plot showing efficiency for different window sizes. Markers placed on points show those targeted for maximization or optimization. Dashed lines show efficiencies outside the optimal range.

In any one or more aspects herein, an objective of the present method is to determine a sampling efficiency based on a defined, or pre-defined, set of window sizes, preferably to maximize the minimum efficiency, η, for a user defined set of window sizes, S. The objective function can be therefore defined as:

$$\max_{\alpha}\left(\min_{N \in S}(\eta(\alpha, N))\right)$$

with $$\eta(\alpha, N) = \frac{U_{ref}(N)}{U(\alpha, N)}$$

Where N is the number of spokes in the window, and α is the set increment ratio (that can be defined as described above). The present method can be set up as an optimization problem or iterative process. To avoid local optima an optimization algorithm can be run and can be restarted multiple times (or iterations), In an aspect, an optimization algorithm was run or restarted 100 times, with 99 initial values of α drawn from a uniform probability distribution between 0 and 1. An additional initialization can be run with the Golden ratio as the starting value. The optimization or iteration can be performed in MATLAB R2018b (The MathWorks, Inc., Natick, Mass., United States) using optimcon in the Optimization Toolbox using an interior-point minimization algorithm.

The set of window sizes can be determined or selected in a number of ways. In any one or more aspects of any one or more embodiments herein, the set of window sizes can comprise one or more continuous ranges of window sizes. For example, a set of window sizes can contain a plurality of windows with each window having a minimum window size of M spokes, and all intermediate window sizes up to a maximum window size, M+R, such that S={M, M+1, . . . , M+R}. M can be set, for example to 4, 16, and/or 32, and R can be set from 1 to 100. The skilled person would understand that other values for M and R can be applied.

In any one or more aspects of any one or more embodiments herein, a set or the sets of window sizes can be optimized for multiple specific temporal resolutions. For example, the sets can be defined as S={M, 2M}, and S={M, 2M, 3M}. Again, M can be set to 4, 16, and/or 32. Where the Golden ratio approach is expected to perform optimally, S can be chosen to consist of the first five Fibonacci numbers larger than three (S={5, 8, 13, 21, 34}). In an aspect, a set of window sizes can consist of seven different sets of window sizes: S={N 2N}, {N, 2N, 3N}, {N−1, . . . , N+1}, {N−2, . . . , N+2}, {N−3, . . . , N+3}, {N−4, . . . , N+4}, {N−5, ..., N+5}. In a particular aspect, a set of windows can be defined as S={68, 153, 306}, and the set angular increment can be α≈0.277.

The set of window sizes chosen for the optimization can be entirely up to the user and, in certain aspects, can be arbitrarily chosen, but should be chosen by the user to cover all possible reconstructions that the user wishes to perform. The skilled artisan would understand the values embodied herein are demonstrative examples of the present methods. That said, as demonstrated herein, benefits of SILVER over traditional golden ratio methods decrease as the set of chosen window sizes gets too large.

In any one or more aspects of any one or more embodiments herein, the sampling method can include using or applying the angular increment determined for the set of window sizes and acquiring an image data set from the radial spokes within the defined set of window sizes. One or more images from the acquired image data set can be reconstructed.

The present approach is not limited to the use of pseudo-continuous ASL (PCASL) labeling. In various aspects, other ASL labeling techniques can be used. These can include the use of a pulsed ASL preparation of labeling, time-encoded (also known as Hadamard encoded) ASL, and a vessel-selective ASL preparation or labeling in which the blood in each feeding artery can be uniquely encoded allowing their contributions to the downstream signal to be extracted in post-processing. This can allow imaging of collateral blood flow and arterial supply to lesions but can also lead to increases in scan time because the number of encoded images required is proportional to the number of arteries of interest. This can be mitigated by leveraging the mutual information shared by the differently encoded images to enable a greater degree of under-sampling.

The radial sampling scheme described herein is well suited to estimation and correction for patient motion. For example, a series of high temporal resolution but low spatial resolution images can be reconstructed, allowing estimation of the subject's position at each point in time. This information can then be incorporated into the image reconstruction to correct for this motion. Alternatively, brief "navigator" scans can be interleaved with the main acquisition to provide an estimate of patient motion, thereby enabling prospective motion correction. This can be important for stroke patients, who can be disoriented and uncomfortable, leading to potentially large motion artefacts if not properly addressed. While SILVER can be used in conjunction with ASL preparations, the skilled artisan would understand that SILVER is not limited to use with ASL.

Radial images with an optimized angular increment in 2D, 3D, or 4D can be reconstructed using standard techniques, such as weighting to correct for the non-uniform density of k-space samples, re-gridding of the samples on to a Cartesian grid and then application of the discrete Fourier transform. When there is a high degree of under-sampling this can lead to significant "noise-like" artefacts in the resulting images [21]. "Compressed sensing" techniques can be introduced that allow highly under sampled images to be reconstructed with high fidelity by using iterative, sparsity-promoting algorithms [29]. In addition, the radial trajectories provided herein can be well suited to this methodology since under-sampling can result in noise-like errors rather than coherent artefacts, which can enable the algorithms to disentangle the true signal amidst the noise. In general, it is possible to reconstruct images with different spatial resolution, as well as temporal resolution, from SILVER optimized acquisitions. When the spatial resolution required can also be lower, images can be reconstructed from a smaller region near the center of k-space where the sampling density of the radial spokes is greater, or additional smoothness constraints can be added to better condition the image reconstruction, or post-hoc spatial smoothing can be used. A range of other image reconstruction techniques can also be used that take advantage of the sparse or low rank nature of the data, or that regularize the reconstruction in other ways, for example, by using mathematical models of the expected signal evolution to constrain the reconstruction.

Methods as described herein can further comprise providing a magnetic resonance imaging (MRI) scanner. Examples of such scanners include 3T scanners, such as a 3T Siemens Prisma, although other scanners may be used. Methods as described herein can further comprise positioning a subject in relation to an imaging scanner as described herein. Methods as described herein can further comprise outputting one or more reconstructed images to a display. The display can be operably connected to or otherwise a part of a computing device or apparatus 1010 (FIG. 10) as described herein.

Additional aspects of the SILVER method are shown in FIG. 12. Applying electrostatic potential measurements, or another desired optimization method as described herein, a user defined set of potential window sizes S, can be inputted an interior-point minimization with multiple starting points performed. From that information, an optimal set increment α can be generated and data acquisition performed utilizing the determined optimal set increment α.

System and Apparatus

Figure 10:
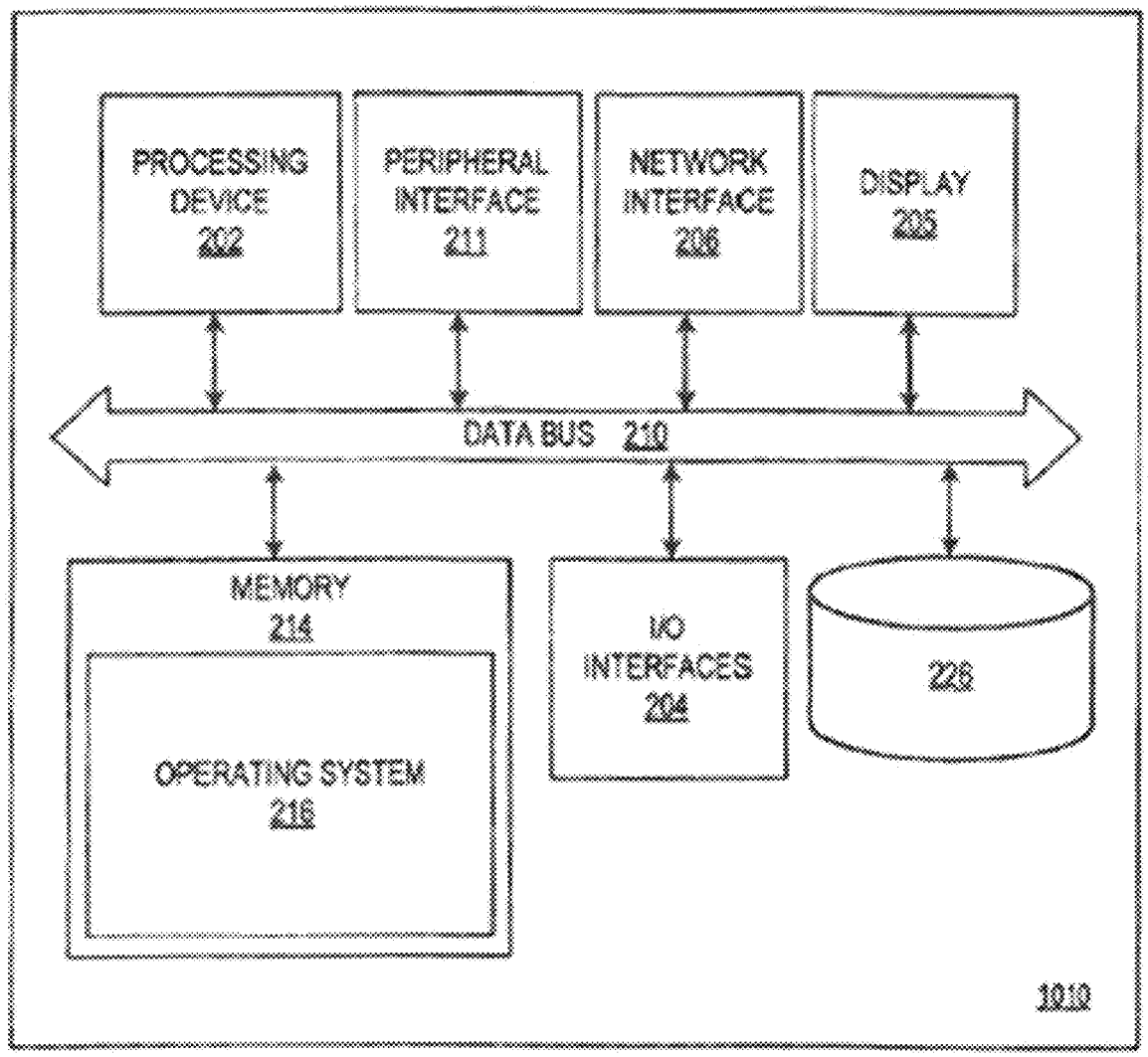
FIG. 10 is a schematic block diagram of an apparatus in which embodiments of the present systems and methods for imaging may be implemented.
Figure 11:
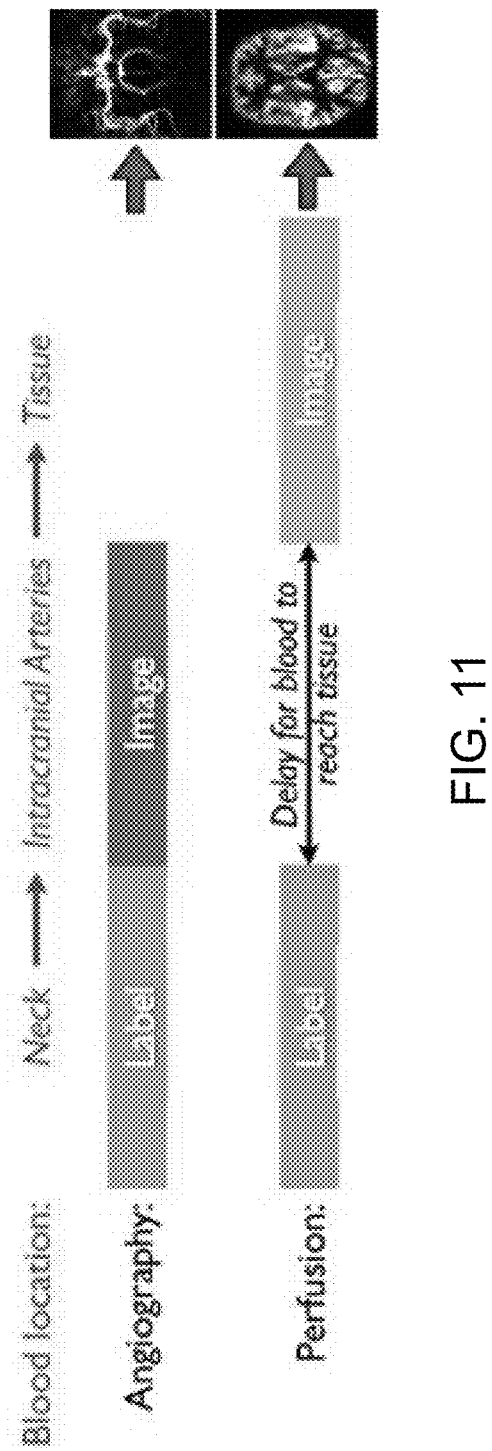
FIG. 11 depicts a method of combined acquisition of angiography and perfusion data to which, in an embodiment, the present SILVER methods and systems can be applied.

Reference is now made to FIG. 10, which depicts an apparatus 1010 in which the systems and methods as described herein may be implemented. The apparatus 1010 may be embodied in any one of a wide variety of wired and/or wireless computing devices, multiprocessor computing device, and so forth. As shown in FIG. 10, the apparatus 1010 comprises memory 214, a processing device 202, one or more input/output interfaces 204, a network interface 206, a display 205, a peripheral interface 211, and mass storage 226, wherein each of these devices are connected across a local data bus 210. The apparatus 1010 may be coupled to one or more peripheral measurement devices (not shown) connected to the apparatus 1010 via the peripheral interface 211.

The processing device 202 may include any custom made or commercially available processor, a central processing unit (CPU) or an auxiliary processor among several processors associated with the apparatus 1010, a semiconductor based microprocessor (in the form of a microchip), a macroprocessor, one or more application specific integrated circuits (ASICs), a plurality of suitably configured digital logic gates, and other well-known electrical configurations comprising discrete elements both individually and in various combinations to coordinate the overall operation of the computing system.

The memory 214 can include any one of a combination of volatile memory elements (e.g., random-access memory (RAM, such as DRAM, and SRAM, etc.)) and nonvolatile memory elements (e.g., ROM, hard drive, tape, CDROM, etc.). The memory 214 typically comprises a native operating system 216, one or more native applications, emulation systems, or emulated applications for any of a variety of operating systems and/or emulated hardware platforms, emulated operating systems, etc. For example, the applications may include application specific software which may be configured to perform some or all of the systems and methods herein. In accordance with such embodiments, the application specific software is stored in memory 214 and executed by the processing device 202. One of ordinary skill in the art will appreciate that the memory 214 can, and typically will, comprise other components which have been omitted for purposes of brevity.

The one or more input/output interfaces 204 provide any number of interfaces for the input and output of data. For example, where the apparatus 1010 comprises a personal computer, these components may interface with one or more user input devices 204. The display 205 may comprise a computer monitor, a plasma screen for a PC, a liquid crystal display (LCD) on a handheld device, a touch screen or other display device.

In an embodiment of this disclosure, a non-transitory computer-readable medium stores programs for use by or in connection with an instruction execution system, apparatus, or device. More specific examples of a computer-readable medium may include by way of example and without limitation: a portable computer diskette, a random access memory (RAM), a read-only memory (ROM), an erasable programmable read-only memory (EPROM, EEPROM, or Flash memory), and a portable compact disc read-only memory (CDROM) (optical).

With further reference to FIG. 10, network interface device 206 comprises various components used to transmit and/or receive data over a network environment. For example, the network interface 206 may include a device that can communicate with both inputs and outputs, for instance, a modulator/demodulator (e.g., a modem), wireless (e.g., radio frequency (RF)) transceiver, a telephonic interface, a bridge, a router, network card, etc.). The apparatus 1010 may communicate with one or more computing devices (not shown) via the network interface 206 over the network 118 (not shown). The apparatus 1010 may further comprise mass storage 226. The peripheral 211 interface supports various interfaces including, but not limited to IEEE-1394 High Performance Serial Bus (Firewire), USB, a serial connection, and a parallel connection.

The apparatus 1010 shown in FIG. 10 may be embodied, for example, as a magnetic resonance apparatus, which includes a processing module or logic for performing conditional data processing and may be implemented either off-line or directly in a magnetic resonance apparatus. For such embodiments, the apparatus 1010 may be implemented as a multi-channel, multi-coil system with advanced parallel image processing capabilities, and direct implementation makes it possible to generate images, for example, immediate T1 maps, available for viewing immediately after image acquisition, thereby allowing re-acquisition on-the-spot if necessary. Examples of apparatus in which the present systems and methods may be implemented are described in U.S. Pat. Nos. 5,993,398 and 6,245,027 and U.S. Publication No. 2011/0181285, which are incorporated by reference as if fully set forth herein.

The flow chart of FIG. 12 shows an example of functionality that may be implemented in the apparatus 1010 of FIG. 10. If embodied in software, each block shown in FIG. 12 may represent a module, segment, or portion of code that comprises program instructions to implement the specified logical function(s). The program instructions may be embodied in the form of source code that comprises machine code that comprises numerical instructions recognizable by a suitable execution system such as the processing device 202 (FIG. 10) in a computer system or other system. The machine code may be converted from the source code, etc. If embodied in hardware, each block may represent a circuit or a number of interconnected circuits to implement the specified logical function(s).

Although the flowchart of FIG. 12 shows a specific order of execution, it is understood that the order of execution may differ from that which is depicted. For example, the order of execution of two or more blocks may be scrambled relative to the order shown.

Also, any logic or application described herein that comprises software or code can be embodied in any non-transitory computer-readable medium for use by or in connection with an instruction execution system such as, for example, a processing device 202 in a computer system or other system. In this sense, each may comprise, for example, statements including instructions and declarations that can be fetched from the computer-readable medium and executed by the instruction execution system.

Systems as described herein can further comprise a magnetic resonance imaging scanner as discussed above and a display operably connected to a computing apparatus 1010 (FIG. 10) or otherwise a part of a computing device as described herein. Such scanners and displays are known in the art.

EXAMPLES

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for.

Example 1

Abstract

Purpose: To present and assess a method for choosing the increment between spokes in radially sampled MRI that can produce higher SNR than Golden ratio derived methods.

Theory and Methods: Sampling uniformity determines image SNR. Thus, for a radial trajectory, uniformly spaced sampling is ideal. However, uniform sampling lacks in post-acquisition reconstruction flexibility, which is often needed in dynamic imaging. Golden ratio-based methods are often used for this purpose. The method presented here, Set Increment with Limited Views Encoding Ratio (SILVER), optimizes sampling uniformity when the number of spokes per frame is partially/approximately known a-priori. With SILVER, an optimization algorithm finds the angular increment that provides the highest uniformity for a pre-define a set of reconstruction window sizes. Here, the optimization cost function was based on an electrostatic model of uniformity. SILVER was tested over multiple sets and assessed in terms of uniformity, analytical g-factor, and SNR both in simulation and applied to dynamic arterial spin labeling angiograms in three healthy volunteers.

Results: All SILVER optimizations produced higher or equal uniformity than the golden ratio within the predefined sets. The SILVER method converged to the golden ratio when no improvement could be achieved. As hypothesized, the g-Factor for SILVER was on average higher than for uniform and lower than golden ratio sampling and SNR followed the same trend both in simulation and in vivo.

Conclusion: SILVER is a simple addition to any sequence currently using golden ratio sampling and it has a small but measurable effect on sampling efficiency.

Introduction

Many recent advances in MRI utilize radial k-space sampling instead of conventional Cartesian sampling. The benefits of radial sampling compared with Cartesian trajectories include reduced sensitivity to motion (1) and spatially incoherent aliasing when sampled below the Nyquist limit (2). For these reasons, radial sampling is often used in highly accelerated and/or dynamic imaging modalities.

Among radial sampling methods, uniformly distributed spokes are the most efficient in terms of signal-to-noise ratio (SNR) because SNR scales inversely with uniformity of sampling density (3). However, uniform radial sampling requires complete a-priori knowledge of how many spokes will be combined to form an image during reconstruction. This is not always possible. For example, when data is retrospectively binned based on respiratory or cardiac phases, the number of spokes to include in each phase is unknown at the time of acquisition. Uniform sampling does also not allow for flexibility in reconstructing the same dataset at multiple temporal resolutions. Multiple temporal resolutions can be useful for retrospectively being able to trade spatial resolution for temporal resolution, as well as the ability to create a fully sampled temporal average image by combining data from many under-sampled frames for example for coil sensitivity estimation (4).

A commonly used alternative to uniform sampling is the radial golden ratio (5) or tiny golden angle method (6). In these methods, the direction of each k-space sampling spoke is determined as a set angle increment from the previous spoke, such that each new spoke intersects the largest gap in k-space by the golden ratio. This results in relatively high uniformity for any number of subsequently acquired spokes and allows for complete flexibility in temporal resolution.

However, because imaging experiments are generally designed for reconstruction with a specific temporal resolution or a range of window sizes (numbers of spokes per frame), it is proposed that the ability of golden ratio sampled methods to get approximate uniformity for all possible window sizes is un-necessarily general for most applications. Therefore, the present radial imaging method is provided, where optimization of the angular increment between subsequent spokes is performed for a restricted set of window sizes with the objective of maximizing the uniformity of sampling within that set. By relaxing the requirement for 'near-uniformity' restricted to only apply to a specific set of window sizes, it is hypothesized that higher sampling efficiency can be achieved whilst maintaining the other favorable properties provided by the Golden ratio methods. In this disclosure a procedure for choosing a different fixed angular increment based on numerical optimization is disclosed and compared with both the Golden ratio method and with uniform sampling in simulations and in vivo. The proposed method is referred to as the Set Increment with Limited Views Encoding Ratio (SILVER) method.

Theory 2.1 Properties of Set Increment Sampling

For 2D radial trajectories a set increment is simply a constant angle increment ($\theta = \alpha \times 180°$) from the previous spoke. Depending on whether this step is a rational or irrational fraction of the whole circle the acquired data can be combined in different ways.

When the step ratio, $\alpha$, is a rational fraction, the exact same spoke will eventually be repeated, whereas if the step is irrational or rational with a very large denominator in its simplest form, no two spokes acquired within the duration of the experiment will be the same. In dynamic imaging experiments where the length of a frame is unknown a-priori, practically irrational increments are preferred to avoid acquiring the same spoke again within the frame. Similarly, if multiple temporal resolutions are required it is also beneficial to use irrational sampling to avoid duplicate spokes in the different window sizes, especially if data is combined across frames to be reconstructed such that the Nyquist criterion is met. For this reason, the golden ratio, which is often referred to as the most irrational number (7), is often used to sample when no periodicity is wanted, and every new spoke should fill k-space with near-optimal uniformity.

Another benefit of acquiring data in k-space with a set angular increment, regardless of whether the step ratio is rational or irrational, is that images with the same sampling efficiency can be reconstructed with any N subsequently acquired spokes. Each k-space trajectory will simply be a rotated version of the N previous spokes, rotated by $N\alpha \times 180°$ (FIGS. 1A-1C). This allows for sliding window (8) and view sharing (9) reconstructions with complete flexibility in where to start and end each frame.

Uniform radial sampling with full width spokes can be achieved with set increment sampling by choosing the angular increment between subsequently acquired spokes to be $$\alpha_{uniform} = \frac{1}{N},$$

where N is the number of spokes used to reconstruct one frame. In golden ratio sampling, on the other hand, the step is instead approximately 111.24°, with $$\alpha_{golden} = \frac{1}{\phi} = \frac{\sqrt{5}-1}{2} \approx 0.6180.$$

The objective of SILVER is to find a more optimal increment, $0 < \alpha < 1$, when near uniformity is only required for a certain set of window sizes.

2.2 Measuring Sampling Efficiency

Radial sampling in a linear acquisition and reconstruction framework has intrinsically lower SNR than Cartesian sampling due to the variable density with which k-space is sampled (10). Among radial sampling methods, radially uniform sampling achieves the highest SNR, and performance for a fixed number of spokes degrades the more non-uniform the sampling is.

Because SNR intrinsically depends on the local sampling density, different methods for estimating the local sampling density have been proposed. For radial sampling in particular, Winkelmann et al (5), defined sampling density by the inverse of the average azimuthal distance between adjacent spokes. Others have used analytically defined continuous density distributions that were used to generate the trajectory (10), numerically defined approaches using voronoi cells on spheres (11), or physical models based on electrostatic properties (12-14). Electrostatic methods are more commonly used as a 3D method but can also be generalized to 2D sampling. An electrostatic potential minimizing model can be used in SILVER because of its easy extension to 3D in the future and its high penalty for overlapping spokes.

The electrostatic potential method models the radial sampling pattern as an ensemble of unit charges placed on both ends of each sampling spoke, constrained to the unit circle (2D) or unit sphere (3D). Efficiency compared to radially uniform sampling, η is then defined as the ratio of total electrostatic potential stored in the system of point charges, U, to a system with the same number of uniformly distributed points (the lowest possible energy state), $U_{ref}$:

$$\eta = \frac{U_{ref}}{U} \quad \text{(eq. 1)}$$

$$U = \sum_{i,j=1}^{2N(i \neq j)} 1/r_{ij} \quad \text{(eq. 2)}$$

Where $r_{ij}$ is the distance between the ith and jth points, and N is the number of spokes (2N is therefore the number of spoke tips to consider). For a set increment, α, U generalizes to a function of α and N. For a uniform distribution α is 1/N so $U_{ref}$ is simply a function of N.

Methods

The SILVER method was set up as an optimization problem, where the task was to maximize the minimum efficiency, η, for a user defined set of window sizes, S. The objective function was therefore defined as:

$$\max_\alpha \left( \min_{N \in S} (\eta(\alpha, N)) \right) \quad \text{(eq. 3)}$$

with $$\eta(\alpha, N) = \frac{U_{ref}(N)}{U(\alpha, N)} \quad \text{(eq. 4)}$$

Where N is the number of spokes in the window, and α is the set increment ratio (as defined in section 2.1). To avoid local minima the optimization algorithm was restarted 99 times with initial values of α drawn from a uniform probability distribution between 0 and 1. One additional initialization was run with the Golden ratio as the starting value. The optimization was performed in MATLAB R2018b (The MathWorks, Inc., Natick, Mass., United States) using optimcon in the Optimization Toolbox using the interior-point minimization algorithm.

SILVER was compared to golden ratio sampling for a large range of plausible sets of target window sizes, S. The efficiency was estimated for both sampling methods using the electrostatic potential method as described in section 2.2. First, continuous ranges of window sizes were explored. These sets contained a minimum window size of M spokes, and all intermediate window sizes up to a maximum window size, M+R, such that S={M, M+1, . . . , M+R}. M was set to 4, 16, and 32, and R was set from 1 to 100.

Similarly, the effect of optimizing for multiple specific temporal resolutions was examined. The efficiency for sets with S={M, 2M}, and S={M, 2M, 3M} were studied. Again, M was set to 4, 16, and 32. As a final edge case, where the golden ratio approach is expected to perform optimally, S was chosen to consist of the first five Fibonacci numbers larger than three (S={5, 8, 13, 21, 34}).

Maps of noise amplification due to acquisition operator non-orthogonality (g-factor (15)) were produced for SILVER, golden ratio and uniform sampling trajectories. To create g-factor maps, the linear acquisition operator, E=FS, with S being a set of eight coil sensitivities (compressed from a 32-channel sensitivity map measured in a phantom) and F being the discrete Fourier transform operator for samples along the trajectory, was calculated. The g-factor maps were then generated by analytic evaluation of the acquisition operator as described by Pruessmann et al. (15). g-Factor maps were calculated for five different window sizes, N=16, 32, 48, 64, 128. For each window size the map mean intensity was evaluated for a golden ratio trajectory, a uniformly sampled radial trajectory, and for SILVER optimized for seven different sets of window sizes: S={N, 2N}, {N, 2N, 3N}, {N−1, . . . , N+1}, {N−2, . . . , N+2}, {N−3, . . . , N+3}, {N−4, . . . , N+4}, {N−5, . . . , N+5}.

Simulated multi-coil acquisition and reconstruction of a dynamic numerical phantom (a simple 64×64 moving image) was also done with the same coil sensitivity map used for g-factor estimation. The image reconstruction quality of these iterative SENSE reconstructions was compared by measuring the spatial SNR (average signal in phantom divided by the standard deviation in the background) for 10 different noise instances.

Finally, in vivo dynamic pseudo-continuous arterial spin labelling (pCASL) angiography datasets were acquired from three healthy volunteers under a technical development protocol approved by local ethics and institutional committees using a 3 Tesla Verio scanner (Siemens Healthineers, Erlangen, Germany). Data was acquired with 5 different protocols:

1. Uniform sampling, 68 spokes per frame, 27 frames, α=1/68 (acceleration factor, R≈4)
2. Uniform sampling, 153 spokes per frame, 12 frames, α=1/153 (R≈2)
3. Uniform sampling, 306 spokes per frame, 6 frames, α=1/306 (R≈1)
4. Golden ratio sampling, α=1/φ≈0.6180 . . . .
5. SILVER optimized for S={68, 153, 306}, α≈0.2770 . . . .

For all protocols, a 600 ms pCASL labeling phase was followed by a 1288 ms continuous GRE Look-Locker readout (TE=5.95 ms, TR=11.7 ms, FA=7°) where 108 spokes were acquired. A total of 1836 spokes (17 shots) were acquired for the tag and control conditions respectively. The spokes were ordered such that combining the 17 shots resulted in the expected set increment trajectory (16). Total scan time for each protocol was 1 min 8 s.

Figures 13A, 13B, 13C:
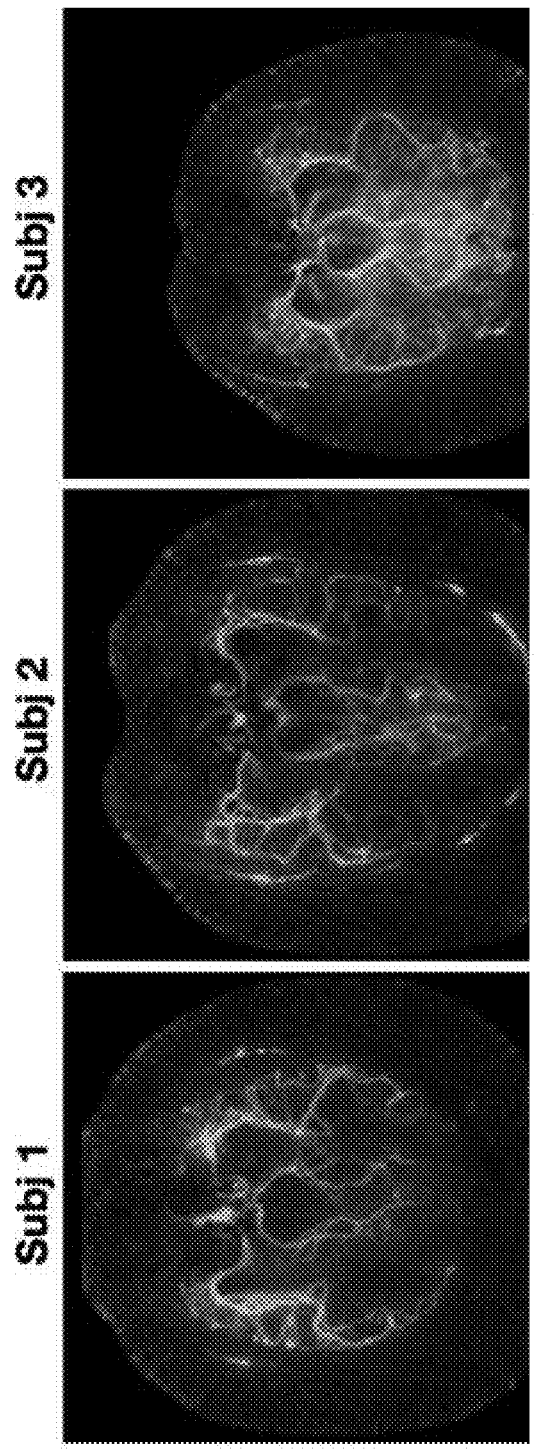
FIGS. 13A-13C the masks used in-vivo for SNR estimation. Signal was estimated as mean intensity in the region defined by the red mask. Noise was defined as standard deviation of signal in the region defined by the blue mask.

All in vivo data was reconstructed with an iterative SENSE reconstruction in MATLAB. In vivo SNR was measured by applying a mask to the vessels and averaging for signal, the mask was then dilated and the standard deviation outside the mask (but within the skull) was taken as noise level. The masks used are available as shown in FIGS. 13A-13C.

Results

Two examples of SILVER and the Golden ratio theoretical efficiencies for specific window sizes are shown in FIG. 2. The minimum efficiency of the SILVER trajectory within each targeted set was higher or equivalent to the trajectory produced by the golden ratio method.

Figure 3A:
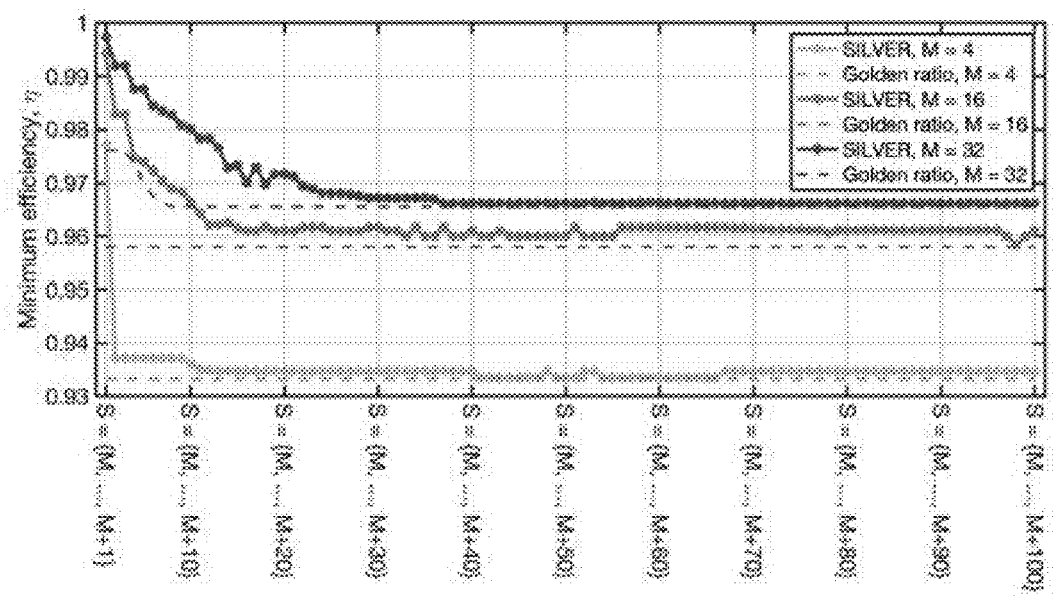
FIGS. 3A-3B are plots of minimum efficiency tor sets of continuous ranges of window sizes. SILVER can outperform the golden ratio if the range is short enough. How short the range has to be can depend on the minimum number of spokes as shown in (FIG. 3A). For pairs and triples of window sizes SILVER performed much better than the golden ratio, but in the golden ratio optimal case (Fibonacci numbers) they were equally good as shown in (FIG. 3B). The y-axis in both graphs, $\eta$, represents the minimum efficiency within the SILVER targeted range
Figure 3B:
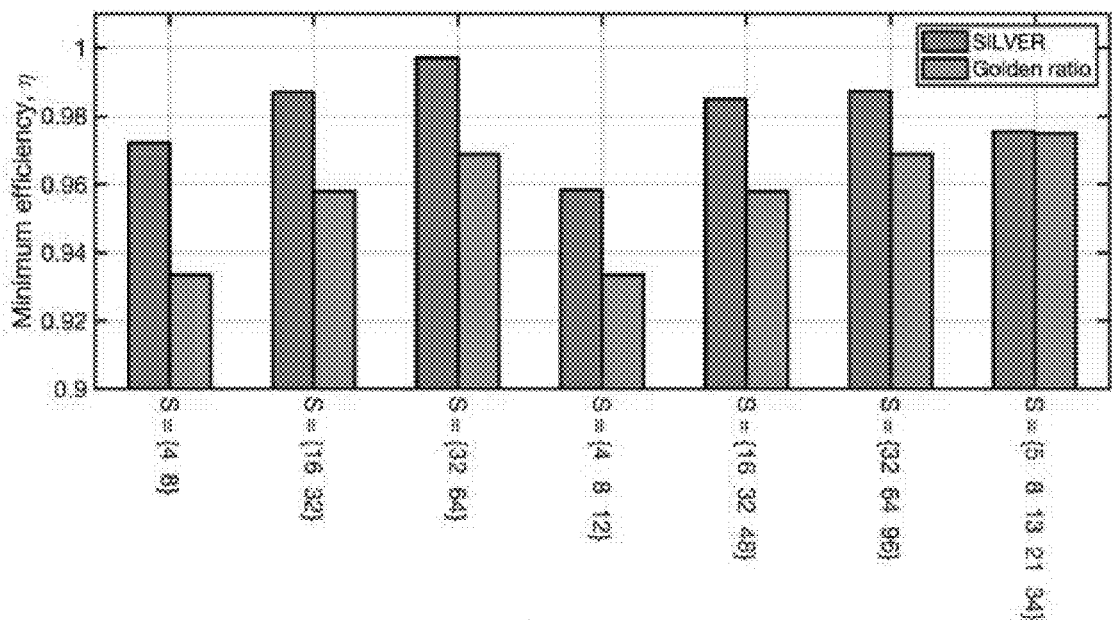

SILVER minimum efficiency was higher than the golden ratio method for both continuous sets (FIG. 3A), and multiple temporal resolutions (FIG. 3B), although the improvement was negligible for large window ranges and for the set containing five Fibonacci numbers of spokes. The maximum observed improvement over the golden ratio was 4.7% (for S={4, 5}). For a minimum window size, M, of 16 spokes the maximum efficiency increase was 3.8% (for S={16, 17}), and remained above 1% for continuous sets with up to 10 members (S={16, . . . , 25}). Similarly, for a minimum window size, M, of 32, the maximum improvement was 2.2% (for S={32,33}), and remained above 1% for continuous sets with up to 14 members (S={32, . . . , 45}). All multiple temporal resolution experiments except the set of Fibonacci numbers had improvements of more than 1.8%, with the maximum improvement being 4.2% (for S={4, 8}).

Figure 4A:
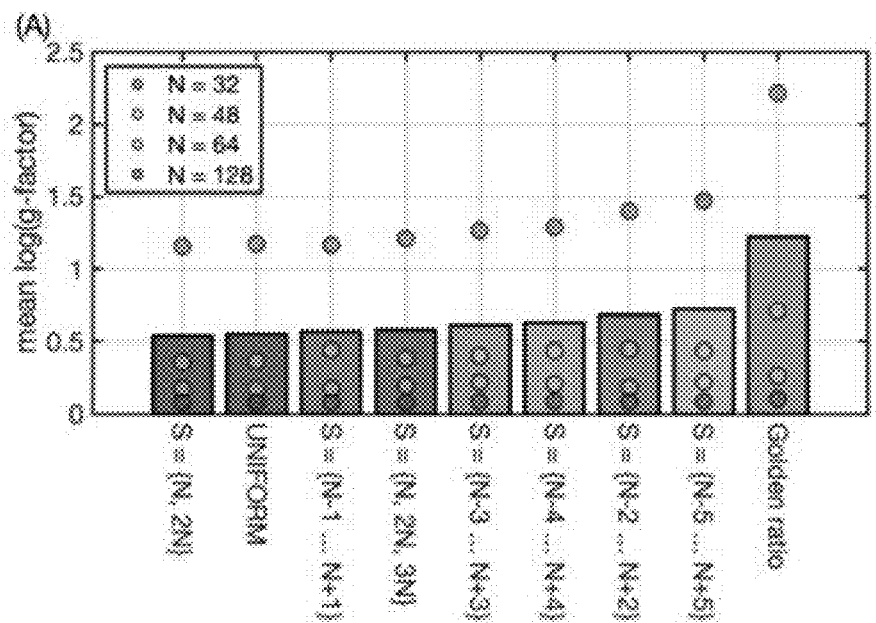
FIGS. 4A-4B show noise amplification in multi-coil SILVER experiments, log-transformed for visibility, as otherwise the difference between numbers of spokes overshadows any difference between the sampling methods.
Figure 4B:
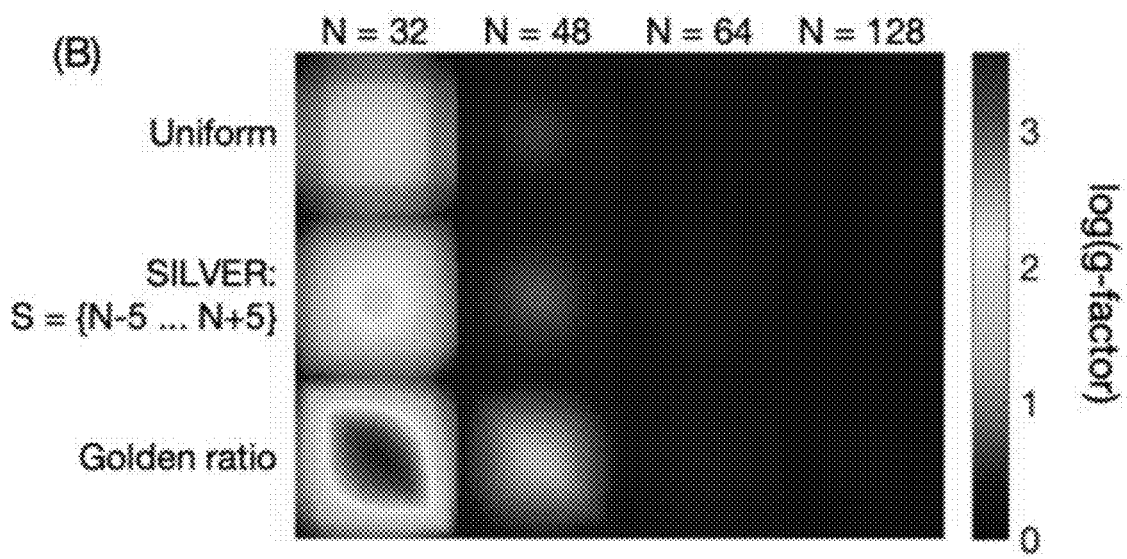

As expected, the g-factor maps produced by the trialed SILVER trajectories had on average higher g-factors than uniform sampling (on average 10% higher than uniform) but lower than the Golden ratio (that was on average 49% higher than uniform). FIG. 4A shows the result for the seven SILVER trials compared to uniform and Golden ratio. FIG. 4B shows an example of relative g-factor maps for a SILVER and a golden ratio trajectory for five different windows.

Figure 5A:
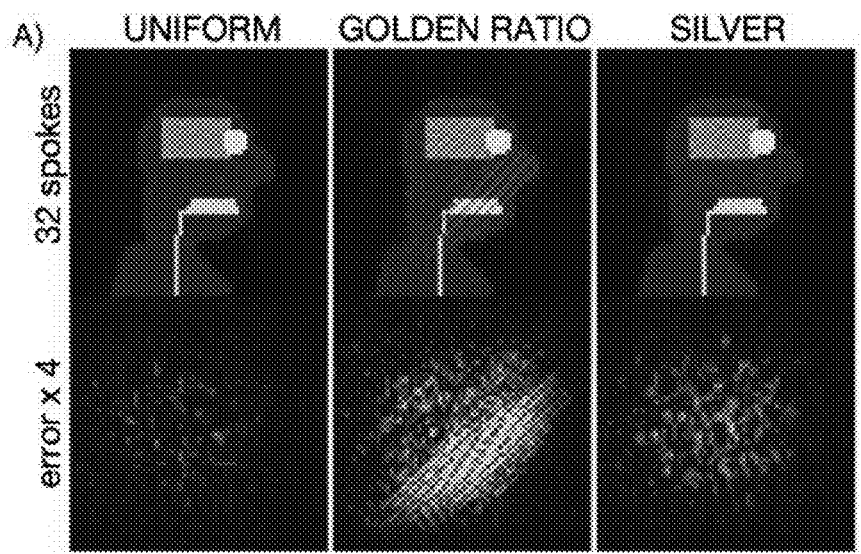
FIGS. 5A-5D and images and plots of a dynamic phantom and in vivo angiogram reconstructed with several methodologies.
Figure 5B:
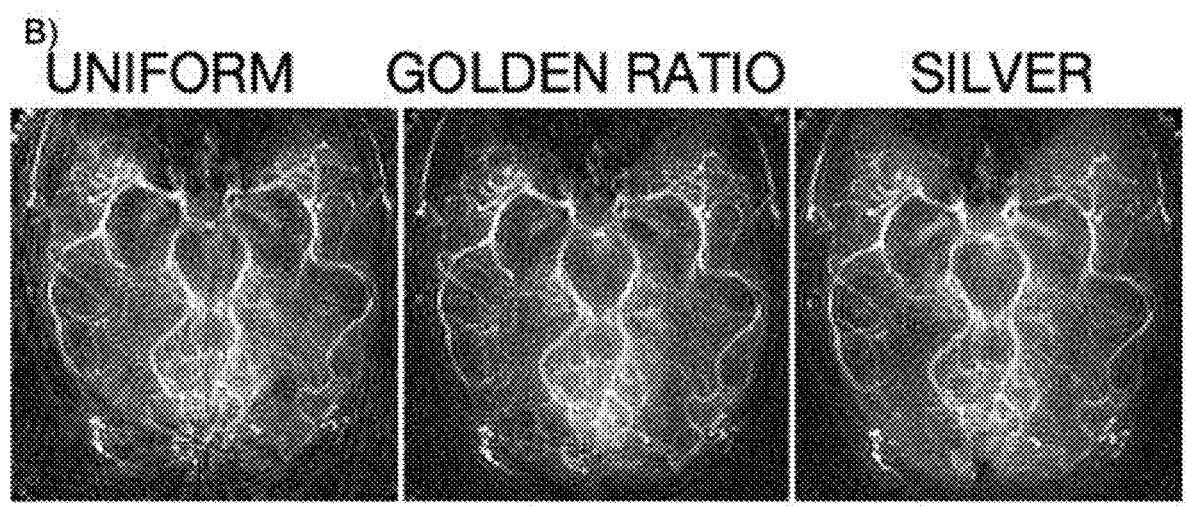
Figure 5C:
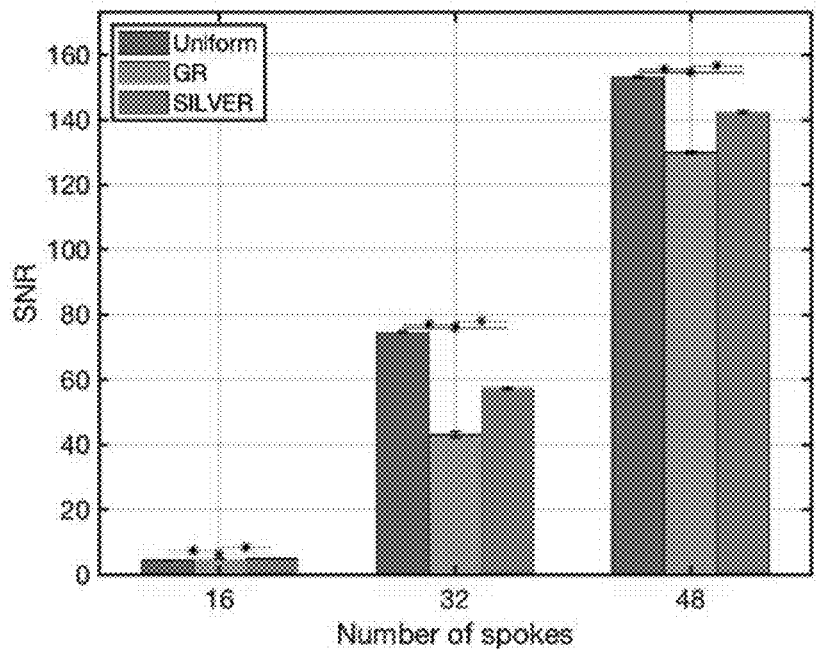
Figure 5D:
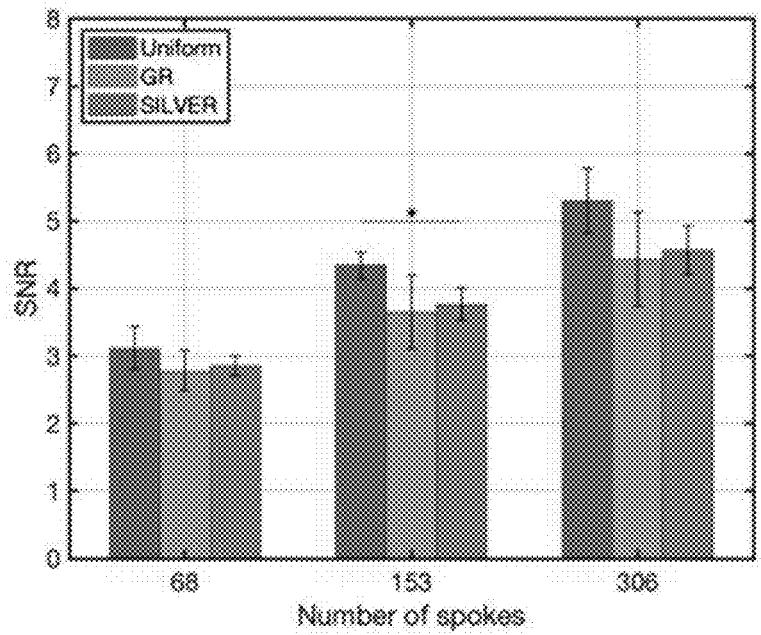

FIG. 5A shows an example frame (32 spokes) of the reconstructions of the digital phantom and FIG. 5B the temporal average of the in vivo angiograms (68 spokes/frame). In the phantom, noise amplification can clearly be seen in the SILVER and golden ratio case compared to uniform sampling. SNR measurements (FIG. 5C) for the 32 and 48 spoke case followed the expected trend of $SNR_{uniform} > SNR_{SILVER} > SNR_{Golden\_ratio}$. However, in the 16 spoke case, all three methods struggled with noise amplification and had low SNR. Surprisingly, in the 16 spoke case $SNR_{SILVER} > SNR_{Golden\_ratio} > SNR_{uniform}$. Potential reasons for this non-intuitive result will follow in the discussion section. SNR measured across the three subjects (FIG. 5D) follow the expected pattern. The subject with uniform sampling exhibits streaking when averaged because across frames because each frame had the exact same trajectory and thus streaking artifacts add up. This is artefact is notably missing from both the SILVER and Golden ratio image.

Discussion and Conclusions

A method of choosing an optimal set angular increment for dynamic radial MRI has been presented when the number of spokes to combine is known to some degree of certainty, or multiple pre-determined temporal resolutions will be used to reconstruct the same dataset. It is shown that this method results in small but measurable and potentially valuable increases in image quality compared to the more general Golden ratio method, with only a very minor change required to the pulse sequence. The SILVER framework also has a potential to be extended to imaging with other trajectories that have previously been derived from the golden ratio, e.g. spirals (17,18), cones (19), and even Cartesian sampling (20).

The SILVER method, as presented, is currently limited by the following considerations, although these limitations also apply to Golden ratio sampling. Firstly, both SILVER and the Golden ratio method only optimize for subsequently sampled spokes, and there is no guarantee that binned data from multiple repeats of radial acquisitions are distributed optimally. Suggestions for overcoming this problem have been proposed for golden ratio sampling by e.g. Fyrdahl et al. (21), and this methods is equally applicable to SILVER optimized sampling.

The concepts presented in this framework can also be extended to non-linear reconstruction. For example, in compressed sensing (22), the incoherence of the sampling operator is important, but lower coherence is achieved when there is no preferential direction of aliased energy, so radial uniformity is beneficial from a coherence point of view as well as SNR. In a linear reconstruction framework, sampling uniformity determines reconstruction quality along with under-sampling factor and coil sensitivity profiles. In non-linear reconstruction, the data itself can contribute to reconstruction quality too, e.g. via the inherent sparsity level.

Because orthogonality of the acquisition operator depends on the coils used, as well as sampling trajectory, optimizing for sampling uniformity alone does not always produce the optimal trajectory. When the under-sampling factor is high, the orthogonality of the acquisition operator can be highly dependent on the combination of these two aspects. This could explain why, at 16 spokes, the Golden ratio performed better than one of the SILVER optimizations (FIG. 4A) and why SNR in the phantom reconstructed with 16 spokes/frame did not follow the expected trend based on uniformity measurement alone. However, without a-priori knowledge of coil sensitivity profiles, optimizing for uniformity is a tractable step towards optimized imaging. The SILVER framework can also be extended to optimize for properties other than trajectory uniformity through design of alternative cost functions.

The properties of a set increment presented in section 2.1 are valid for 2D radial sampling. In 3D, a set increment is harder to define. Chan et al. (11) proposed the multi-dimensional golden means method, a 3D analogy of the golden ratio method with a constant azimuthal angle increment and a constant z-axis increment of the tip of the spoke constrained to the surface of a sphere. However, subsequent frames generated with this method are not simply a rotation of the spokes from the previous frame, and therefore not all image frames are guaranteed to have the same sampling efficiency. Because of the increased complexity of 3D radial sampling and the ambiguity of how to define a set increment, the scope of this example was constrained to focus on the more commonly used 2D case.

In conclusion, SILVER is a method that generalizes set increment sampling beyond golden ratio derived methods when some knowledge of the number of spokes to combine in a frame is known a-priori. When SILVER is applied to a set that no improvement in uniformity can be achieved over the Golden ratio it simply returns the Golden ratio (or a tiny golden ratio). Therefore, sometimes SILVER is better than gold, and when it is not, it is just as good!

Data Availability Statement

SILVER code along with all reconstruction and analysis code used to generate the results and figures in this paper are available on https://github.com/SophieSchau/SILVER. An example of the code is attached hereto as Attachment A which is incorporated in full and made a part of this disclosure.

REFERENCES

1. Nishimura D G, Jackson J I, Pauly J M. On the nature and reduction of the displacement artifact in flow images. Magn. Reson. Med. 1991; 22:481-492 doi: 10.1002/mrm.1910220255.
2. Lustig M, Donoho D L, Santos J M, Pauly J M. Compressed Sensing MRI. IEEE Signal Process. Mag. 2008; 25:72-82 doi: 10.1109/MSP.2007.914728.
3. Liao J-R, Pauly J M, Brosnan T J, Pelc N J. Reduction of motion artifacts in cine MRI using variable-density spiral trajectories. Magn. Reson. Med. 1997; 37:569-575 doi: 10.1002/mrm.1910370416.
4. Feng L, Grimm R, Block K T, et al. Golden-angle radial sparse parallel MRI: Combination of compressed sensing, parallel imaging, and golden-angle radial sampling for fast and flexible dynamic volumetric MRI. Magn. Reson. Med. 2014; 72:707-717 doi: 10.1002/mrm.24980.
5. Winkelmann S, Schaeffter T, Koehler T, Eggers H, Doessel O. An Optimal Radial Profile Order Based on the Golden Ratio for Time-Resolved MRI. IEEE Trans. Med. Imaging 2007; 26:68-76 doi: 10.1109/TMI.2006.885337.
6. Wundrak S, Paul J, Ulrici J, Hell E, Rasche V. A Small Surrogate for the Golden Angle in Time-Resolved Radial MRI Based on Generalized Fibonacci Sequences. IEEE Trans. Med. Imaging 2015; 34:1262-1269 doi: 10.1109/TMI.2014.2382572.
7. Phillips T. The Most Irrational Number. American Mathematical Society Feature Column. http://www.ams.org/publicoutreach/feature-column/fcarc-irrational1. Published August 1999. Accessed Jun. 3, 2020.
8. Jeong H J, Cashen T A, Hurley M C, et al. Radial sliding-window magnetic resonance angiography (MRA) with highly-constrained projection reconstruction (HYPR). Magn. Reson. Med. 2009; 61:1103-1113 doi: 10.1002/mrm.21888.
9. Zhou Z, Han F, Yu S, et al. Accelerated noncontrast-enhanced 4-dimensional intracranial MR angiography using golden-angle stack-of-stars trajectory and compressed sensing with magnitude subtraction. Magn. Reson. Med. 2018; 79:867-878 doi: 10.1002/mrm.26747.
10. Tsai C-M, Nishimura D G. Reduced aliasing artifacts using variable-density k-space sampling trajectories. Magn. Reson. Med. 2000; 43:452-458 doi: 10.1002/(SICI)1522-2594(200003)43:3<452:AID-MRM18>3.0.CO;2-B.
11. Chan R W, Ramsay E A, Cunningham C H, Plewes D B. Temporal stability of adaptive 3D radial MRI using multidimensional golden means. Magn. Reson. Med. 2009; 61:354-363 doi: 10.1002/mrm.21837.
12. Saff E B, Kuijlaars A B J. Distributing many points on a sphere. Math. Intell. 1997; 19:5-11 doi: 10.1007/BF03024331.
13. Jansons K M, Alexander D C. Persistent angular structure: new insights from diffusion magnetic resonance imaging data. Inverse Probl. 2003; 19:1031-1046 doi: 10.1088/0266-5611/19/5/303.
14. Koay C G. A simple scheme for generating nearly uniform distribution of antipodally symmetric points on the unit sphere. J. Comput. Sci. 2011; 2:377-381 doi: 10.1016/j.jocs.2011.06.007.
15. Pruessmann K P, Weiger M, Scheidegger M B, Boesiger P. SENSE: Sensitivity Encoding for Fast MRI. 1999:11.
16. Song H K, Yan L, Smith R X, et al. Noncontrast enhanced four-dimensional dynamic MRA with golden angle radial acquisition and k-space weighted image contrast (KWIC) reconstruction. Magn. Reson. Med. 2014; 72:1541-1551 doi: 10.1002/mrm.25057.
17. Kim Y-C, Narayanan S S, Nayak K S. Flexible retrospective selection of temporal resolution in real-time speech MRI using a golden-ratio spiral view order: Speech MRI using Golden-Ratio Spiral. Magn. Reson. Med. 2011; 65:1365-1371 doi: 10.1002/mrm.22714.
18. Kowalik G T, Steeden J A, Atkinson D, Montalt-Tordera J, Mortensen K H, Muthurangu V. Golden ratio stack of spirals for flexible angiographic imaging: Proof of concept in congenital heart disease. Magn. Reson. Med. 2019; 81:90-101 doi: 10.1002/mrm.27353.
19. Zucker E J, Cheng J Y, Haldipur A, Carl M, Vasanawala S S. Free-breathing pediatric chest MRI: Performance of self-navigated golden-angle ordered conical ultrashort echo time acquisition: Free-Breathing Pediatric UTE Chest MRI. J. Magn. Reson. Imaging 2018; 47:200-209 doi: 10.1002/jmri.25776.
20. Li S, Zhu Y, Xie Y, Gao S. Dynamic magnetic resonance imaging method based on golden-ratio cartesian sampling and compressed sensing. PLOS ONE 2018; 13:e0191569 doi: 10.1371/journal.pone.0191569.
21. Fyrdahl A, Ramos J G, Eriksson M J, Caidahl K, Ugander M, Sigfridsson A. Sector-wise golden-angle phase contrast with high temporal resolution for evaluation of left ventricular diastolic dysfunction. Magn. Reson. Med. 2019:mrm.28018 doi: 10.1002/mrm.28018.
22. Lustig M, Donoho D, Pauly J M. Sparse MRI: The application of compressed sensing for rapid MR imaging. Magn. Reson. Med. 2007; 58:1182-1195 doi: 10.1002/mrm.21391.

Example 2

Introduction

Radial sampling in dynamic MRI has many benefits, including incoherent undersampling artefacts and robustness to motion. Uniform radial sampling[1] provides the highest SNR efficiency but lacks flexibility in choosing temporal windows for reconstruction. Golden angle radial sampling[2], on the other hand, provides near-optimal uniformity for arbitrary window sizes. However, image data are never reconstructed using completely arbitrary numbers of spokes. Sometimes, a few distinct temporal resolutions are required, or a limited range of possible temporal resolutions are of interest. Is it shown that by relaxing the requirement of uniformity for any window size (i.e. [1,∞]), and instead optimising for a set angle increment in a restricted set of window sizes, higher uniformity can be achieved. This method is referred to as the Set Increment with Limited Views Encoding Ratio (SILVER).

Methods

To find the optimal increment for a set of reconstruction windows, S, the minimum efficiency (i.e. uniformity), η, in that window was optimized. Uniformity was estimated by the relative electrostatic potential, U, of a set of charges distributed at the tips of each spoke. The optimisation problem to find α, increment between spokes was formulated:

$$\max_{\alpha}\left\{\min_{N\in S}(\eta(\alpha, N))\right\} \quad (eq. 3)$$

with $$\eta(\alpha, N) = \frac{U_{ref}(N)}{U(\alpha, N)} \quad (eq. 4)$$

Where N is the number of spokes in the window and S is the set of windows optimised for. Uref(N) is the electrostatic potential of N uniformly sampled spokes. Local optima of α were avoided by using 100 random starting estimates, including the golden angle.

Simulations were conducted in MATLAB and efficiency distributions at various sets of window sizes. In-vivo acquisition of highly accelerated 2D arterial spin labelling angiograms[3] were performed in a healthy volunteer at three different temporal resolutions (48, 108, and 216 ms, R≈19, 8.5 and 4.3 respectively) using SILVER optimised angle increments. The ASL data was pre-subtracted before a lightly regularised non-Cartesian SENSE reconstruction was performed.

Results

SILVER produced higher minimum uniformity than the golden angle for all tested windows. FIG. 6 shows two examples. In FIG. 6 numerical simulations of ASL angiographic [32] and perfusion [24] signals, accounting for RF attenuation, were used to compare VFA and constant flip angle (CFA) approaches. One skilled in the art will recognize that other schemes can be implemented in which the flip angle is varied. Small qualitative improvements compared to the golden angle method were observed in vivo (FIGS. 7A-8C).

Discussion

It is shown that radial sampling can be made more efficient than Golden angle approaches whilst maintaining near-uniformity for sliding temporal windows. The set increment only needs to be computed once for a given set of window sizes. It is believed that SILVER provides a good compromise between the complete flexibility in window size provided by golden ratio approaches, and the optimal SNR properties provided by uniform sampling. SILVER could provide an SNR boost for any method currently using golden angle sampling.

Conclusion

Uniformity of radial trajectories can be increased by optimising the set angle increment between spokes for window sizes of interest (as a restricted set of window sizes) instead of using the Golden angle method.

REFERENCES

1. Tsai, C M, et al. Magn Reson Med. 2000.
2. Winkelmann S, et al., IEEE Trans. Med. Imaging 2007.
3. Schauman S S, et al. Magn Reson Med 2020.

Example 3

Introduction

Radial sampling in MRI has many advantages over Cartesian trajectories, including less coherent aliasing when under-sampled and robustness to motion. Uniform radial sampling[1] provides the highest SNR efficiency but lacks flexibility in choosing temporal windows for reconstruction. Golden ratio radial methods, on the other hand, provide near-optimal efficiency for arbitrary windows. This can be performed both for 2D imaging with a set angle increment for each radial spoke[2], or in 3D with a set increment in the azimuthal angle and a set change in height from the kx-ky plane for the tip of the spoke3. A constant increment is beneficial as it makes the efficiency of the reconstruction shift-invariant, allowing for flexible reconstruction windows starting from any spoke.

It is shown that by relaxing the requirement to have close to uniform sampling for any window size in the interval $[1, \infty]$, by instead optimizing for a restricted window size range of interest, [M,N], higher efficiency can be achieved by using different increments, in both 2D and 3D. This is a reasonable limitation, as meaningful images are never reconstructed from just one or a handful of spokes and uniformity is not important once fully sampled. This is referred to as the Set Increment with Limited Views Enhancing Ratio (SILVER) method.

Methods

To find the optimal increment for a range of reconstruction windows, ranging from M to N spokes per image (i.e. the range [M,N]), the maximum SNR inefficiency (as the reciprocal of the SNR efficiency[4] $\eta$) was maximized. The min-max optimization problem was formulated:

$$\max_{(\alpha)} \max_{\Delta \in [M,N]} \frac{1}{\eta(\alpha, \Delta)} \qquad (eq. 5)$$

with $$\eta(\alpha, \Delta) = \frac{\sqrt{A^2 \Delta}}{\sqrt{\sum_{i=1}^{\Delta}(d(\alpha)^{-2})}} \qquad (eq. 6)$$

Where $\alpha \in \mathbb{R}$ is the increment for 2D sampling, and $\alpha \in \mathbb{R}^2$ consists of the two increments needed for 3D sampling, and $\Delta$ is the number of spokes in the window. d is an estimate of the local sampling density for each spoke (the inverse of the average angle to the two nearest spokes in $2D^2$, and the inverse of the area on a unit hemisphere occupied by each spoke tip, via a spherical Voronoi parcellation, in 3D). The normalizing constant A is pi in 2D and 2pi in 3D. Local optima were avoided by selecting the optimum found across multiple starting estimates.

The optimal increments for the following windows [M,N] were estimated in 2D and 3D: M=3, 10, 100, and N=10, 50, 100. The efficiencies were then compared with the golden ratio sampling in the window size ranges of interest.

Results

Figure 8:
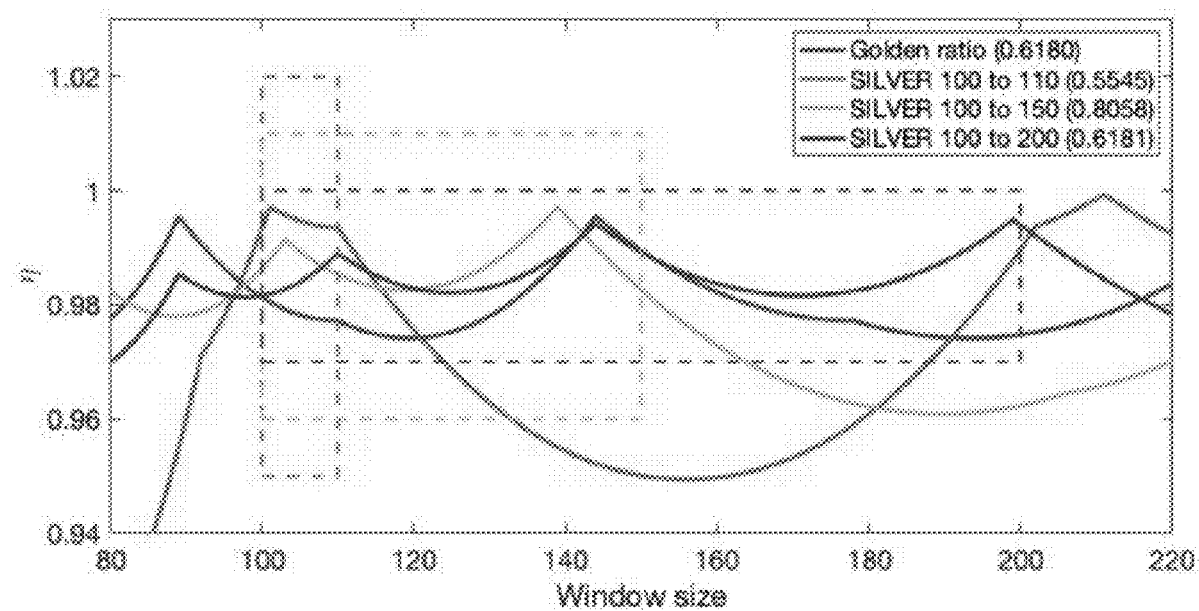
FIG. 8 is a plot showing SILVER efficiencies optimized in three window size ranges (dashed boxes) compared with the golden ratio efficiency for a 2D acquisition. The ratio used to find the increment is reported in parenthesis in the legend. (The results in 3D are similar.)

SILVER produced higher minimum efficiencies than the golden means method within the specified window range for all tested windows. FIG. 8 shows an example of the efficiencies of some of the different ranges of spokes for 2D. For large windows or windows starting from only 3 spokes in 2D, the optimized increment was approximately the golden ratio.

Figures 9A, 9B:
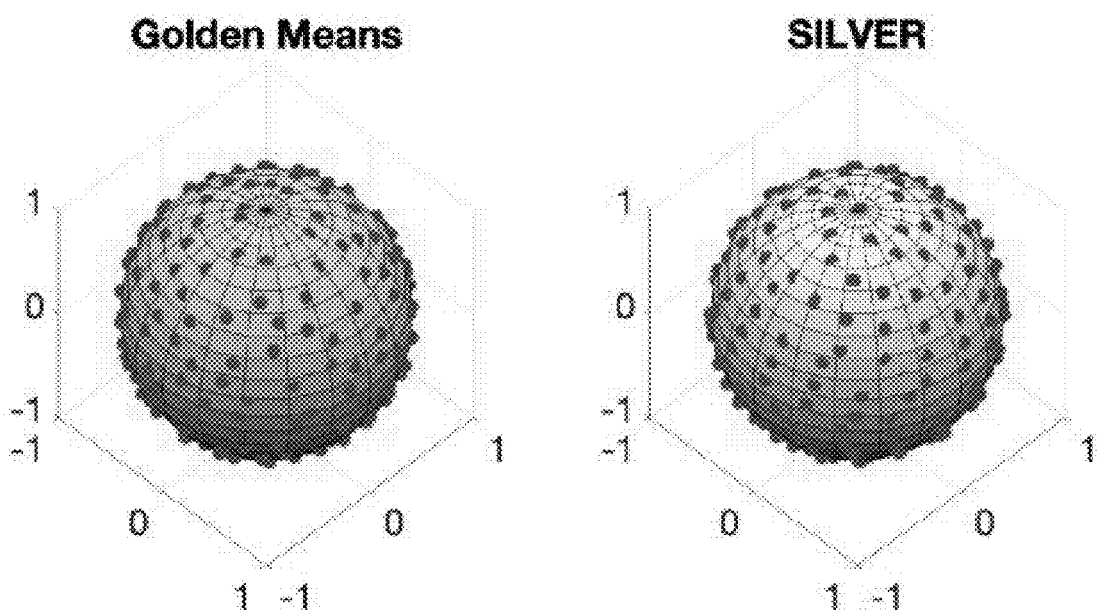
FIGS. 9A-9B show spoke tip positions for 3D sampling using 100 spokes acquired with the Golden means method (left.

As another example, a comparison between a hundred 3D spokes sampled using 2D golden means, and the SILVER method (optimized for M=100, N=110), was shown. FIGS. 9A-9B show how the spokes are distributed over a sphere. Their respective PSF-peak-to-sidelobe measurements are (11.8 (Golden means), and 12.9 (SILVER)).

Discussion

It is shown that when the range of reconstruction windows is pre-decided, radial sampling can be made more efficient than Golden ratio approaches whilst maintaining near-uniform efficiency for sliding temporal windows.

Estimating efficiency using the fraction of k-space occupied by each 3D radial spoke tip is a non-trivial problem. Voronoi-parcellation was used, but cost functions including terms for properties such as the electrostatic potential[1] or the PSF peak-to-sidelobe ratios could also be used to optimize for the required property of interest. The problem is non-convex and therefore requires multiple restarts to avoid getting stuck in local minima, but optimal increments only need to be computed once for a given window size range of interest.

Thus, SILVER provides a good compromise between the complete flexibility in window size provided by golden ratio approaches, and the optimal SNR and PSF properties provided by uniform sampling. SILVER can provide an SNR boost for methods currently using Golden ratio-based methods, for example combined perfusion and angiography imaging with ASL[6] that requires flexible temporal resolution, or other dynamic imaging methods that require flexible temporal windowing[7,8].

REFERENCES

1. Saff E B, Kuijlaars A B J. Distributing many points on a sphere. The Mathematical Intelligencer 1997; 19:5-11 doi: 10.1007/BF03024331.
2. Winkelmann S, et al., An Optimal Radial Profile Order Based on the Golden Ratio for Time-Resolved MRI. IEEE Trans. Med. Imaging 2007; 26:68-76

3. Chan R W, et al., Temporal stability of adaptive 3D radial MRI using multidimensional golden means. Magn. Reson. Med. 2009; 61:354-363
4. Tsai, C M, and D G Nishimura. "Reduced Aliasing Artifacts Using Variable-Density k-Space Sampling Trajectories." Magn Reson Med. 43, no. 3 (Jan. 1, 2000): 452-58.
5. Wundrak S, et al. Golden Ratio Sparse MRI Using Tiny Golden Angles. Magn. Reson. Med. 2016; 75:2372-2378
6. Okell T W. Combined angiography and perfusion using radial imaging and arterial spin labeling. Magn. Reson. Med 2019; 81:182-194
7. Feng L, et al., Golden-angle radial sparse parallel MRI: Combination of compressed sensing, parallel imaging, and golden-angle radial sampling for fast and flexible dynamic volumetric MRI: iGRASP: Iterative Golden-Angle RAdial Sparse Parallel MRI. Magn Reson Med. 2014; 72:707-717
8. Zhou Z, et al., Accelerated noncontrast-enhanced 4-dimensional intracranial MR angiography using golden-angle stack-of-stars trajectory and compressed sensing with magnitude subtraction. Magn. Reson. Med 2018; 79:867-878

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figure of the numerical value. In addition, the phrase "about 'x' to 'y'" includes "about 'x' to about 'y'".

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

Therefore, the following is claimed:

1. A computer implemented method for radially-based MR imaging, comprising:
  (a) defining a set of window sizes for radially-based MR image reconstruction, the set of window sizes comprising a plurality of window sizes, wherein each window size is defined as the number of radial spokes in a window;
  (b) applying a uniformity metric to the defined set of window sizes to determine a sampling efficiency of any sampling pattern generated therefrom with a set angular increment between subsequent radial spokes within a window;
  (c) determining a desired angular increment within the defined set of window sizes based on the applied uniformity metric and the determined sampling efficiency;
  (d) applying the desired angular increment determined in step (c) to acquire an MR image data set using the radial spokes; and
  (e) reconstructing one or more MR images from the acquired MR image data set.

2. A computer implemented method for radially-based MR imaging, comprising:
  (a) defining a set of window sizes for image reconstruction, the set of window sizes comprising a plurality of window sizes, wherein each window size is defined as the number of radial spokes in a window;
  (b) applying a uniformity metric to the defined set of window sizes to determine a sampling efficiency of any sampling pattern generated therefrom with a set angular increment between subsequent radial spokes within a window;
  (c) determining a desired angular increment based on the applied uniformity metric within the defined set of window sizes;
  (d) applying the desired angular increment determined in step (c) to acquire an image data set using the radial spokes; and
  (e) reconstructing one or more images from the acquired image data set,
  wherein the method used to determine a local sampling density as the uniformity metric for determining the sampling efficiency uses a Clustered-Random-Regular (CRR) metric.

3. A system for radial MR imaging comprising: at least one computing device; at least one application executable in the at least one computing device, the at least one application comprising logic that when executed in the at least one computing device:
  (a) defines a set of window sizes for MR image reconstruction, the set of window sizes comprising a plurality of window sizes, wherein each window size is defined as the number of radial spokes in a window;
  (b) applies a uniformity metric to the defined set of window sizes to determine a sampling efficiency of any sampling pattern generated therefrom with a set angular increment between subsequent radial spokes within a window;
  (c) determines a desired angular increment within the defined set of window sizes based on the applied uniformity metric and the determined sampling efficiency;
  (d) applies the desired angular increment determined in step (c) to acquire an MR image data set using the radial spokes; and
  (e) reconstructs one or more MR images from the acquired MR image data set.

4. The computer implemented method of claim 1, wherein the radially-based MR imaging comprises sampling k-space radial spokes and the direction of each k-space radial sampling spoke is determined as a set or fixed angular increment from a previous radial spoke.

5. The computer implemented method of claim 1, wherein the angular increment of step (b) is the reciprocal of the number of radial spokes to be used to reconstruct one window frame or size, or wherein the desired angular increment is calculated to maximize the uniformity of sampling within the defined set of window sizes.

6. The computer implemented method of claim 1, wherein an average distance to nearest radial neighbors is used as the uniformity metric for determining sampling efficiency, or wherein an electrostatic potential method is used as the uniformity metric for determining the sampling efficiency, or wherein the locus of each radial spoke and determining how far away each radial spoke is away from its neighbors is used as the uniformity metric for determining the sampling efficiency.

7. The computer implemented method of claim 1, wherein electrostatic potential measurements which produce the lowest electrostatic potential within the set of window sizes method is used as the uniformity metric for determining the sampling efficiency, or wherein the Pipe-Menon method is used as the uniformity metric for determining the sampling efficiency.

8. The computer implemented method of claim 1, wherein in step (c) the defined set of window sizes is comprised of windows having varying sizes, the size of each window defined by the number of radial spokes in the window.

9. The computer implemented method of claim 1, wherein the desired angular increment of step (d) is an angular increment $180*\alpha$ degrees, wherein $0<\alpha<1$.

10. The computer implemented method of claim 1, wherein the MR radially-based imaging includes taking radial samples in a plane, or wherein the radially-based MR imaging includes taking radial samples within a sphere of k-space.

11. The computer implemented method of claim 1, wherein a fixed angular increment, and a fixed step in a direction perpendicular to the plane of angular rotation of the radial spokes are applied.

12. The computer implemented method of claim 1, wherein both the angular increment and a linear step in another direction are applied to acquire the image data set.

13. The system of claim 3, wherein the radially-based MR imaging comprises sampling k-space radial spokes and the direction of each k-space radial sampling spoke is determined as a set or fixed angular increment from a previous radial spoke.

14. The system of claim 3, wherein the angular increment of step (b) is the reciprocal of the number of radial spokes to be used to reconstruct one window frame or size, or wherein the desired angular increment is calculated to maximize the uniformity of sampling within the defined set of window sizes.

15. The system of claim 3, wherein
an average distance to nearest radial neighbors is used as the uniformity metric for determining sampling efficiency, or wherein an electrostatic potential method is used as the uniformity metric for determining the sampling efficiency, or wherein the locus of each radial spoke and determining how far away each radial spoke is away from its neighbors is used as the uniformity metric for determining the sampling efficiency.

16. The system of claim 3, wherein electrostatic potential measurements which produce the lowest electrostatic potential within the set of window sizes method is used as the uniformity metric for determining the sampling efficiency, or wherein the Pipe-Menon method is used as the uniformity metric for determining the sampling efficiency.

17. The system of claim 3, wherein the method used to determine a local sampling density as the uniformity metric for determining the sampling efficiency uses a Clustered-Random-Regular (CRR) metric.

18. The system of claim 3, wherein in step (c) the defined set of window sizes is comprised of windows having varying sizes, the size of each window defined by the number of radial spokes in the window.

19. The system of claim 3, wherein the desired angular increment of step (d) is an angular increment $180*\alpha$ degrees, wherein $0<\alpha<1$.

20. The system of claim 3, wherein the MR radially-based imaging includes taking radial samples in a plane, or wherein the MR radially-based imaging includes taking radial samples within a sphere of k-space.

21. The system of claim 3, wherein a fixed angular increment, and a fixed step in a direction perpendicular to the plane of angular rotation of the radial spokes are applied.

22. The system of claim 3, wherein both the angular increment and a linear step in another direction are applied to acquire the image data set.

\* \* \* \* \*